(12) United States Patent
Yen et al.

(10) Patent No.: US 8,786,060 B2
(45) Date of Patent: Jul. 22, 2014

(54) SEMICONDUCTOR PACKAGE INTEGRATED WITH CONFORMAL SHIELD AND ANTENNA

(75) Inventors: Han-Chee Yen, Taipei (TW); Chi-Sheng Chung, Kaohsiung (TW); Kuo-Hsien Liao, Taichung (TW); Yung-I Yeh, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 101 days.

(21) Appl. No.: 13/464,910

(22) Filed: May 4, 2012

(65) Prior Publication Data

US 2013/0292808 A1 Nov. 7, 2013

(51) Int. Cl.
*H01L 23/552* (2006.01)
*H01L 21/00* (2006.01)

(52) U.S. Cl.
USPC ............................................ 257/660; 438/63

(58) Field of Classification Search
USPC ................................ 257/659–660, 687–690, 257/E31.001–E31.131; 438/59–63
See application file for complete search history.

(56) References Cited

U.S. PATENT DOCUMENTS

| | | |
|---|---|---|
| 3,761,782 A | 9/1973 | Youmans |
| 4,394,712 A | 7/1983 | Anthony |
| 4,499,655 A | 2/1985 | Anthony |
| 4,569,786 A | 2/1986 | Deguchi |
| 4,807,021 A | 2/1989 | Okumura |
| 4,814,205 A | 3/1989 | Arcilesi et al. |
| 4,842,699 A | 6/1989 | Hua et al. |
| 4,897,708 A | 1/1990 | Clements |
| 4,982,265 A | 1/1991 | Watanabe et al. |
| 5,023,624 A * | 6/1991 | Heckaman et al. ........... 343/860 |
| 5,166,097 A | 11/1992 | Tanielian |
| 5,166,772 A | 11/1992 | Soldner et al. |
| 5,191,405 A | 3/1993 | Tomita et al. |
| 5,229,647 A | 7/1993 | Gnadinger |
| 5,239,448 A | 8/1993 | Perkins et al. |
| 5,308,443 A | 5/1994 | Sugihara |
| 5,353,498 A | 10/1994 | Fillion et al. |
| 5,355,016 A | 10/1994 | Swirbel et al. |
| 5,404,044 A | 4/1995 | Booth et al. |
| 5,557,142 A | 9/1996 | Gilmore et al. |
| 5,615,477 A | 4/1997 | Sweitzer |
| 5,639,989 A | 6/1997 | Higgins, III |
| 5,643,831 A | 7/1997 | Ochiai et al. |
| 5,677,511 A | 10/1997 | Taylor et al. |
| 5,694,300 A | 12/1997 | Mattei et al. |
| 5,776,798 A | 7/1998 | Quan et al. |
| 5,886,876 A | 3/1999 | Yamaguchi |

(Continued)

FOREIGN PATENT DOCUMENTS

| | | |
|---|---|---|
| JP | 08-288686 A | 1/1996 |
| JP | 2002246540 A | 8/2002 |

(Continued)

*Primary Examiner* — Calvin Lee
(74) *Attorney, Agent, or Firm* — Morgan Law Offices, PLC

(57) ABSTRACT

A semiconductor package includes a substrate, a semiconductor die, a package body, an electromagnetic interference shield, a dielectric structure and an antenna element. The substrate comprises a grounding segment and a feeding point. The semiconductor die is disposed on the substrate. The package body encapsulates the semiconductor die. The electromagnetic interference shield is formed on the package body. The dielectric structure encapsulates the electromagnetic interference shield. The antenna element is formed on the dielectric structure and electrically connecting the grounding segment of the substrate and the feeding point.

18 Claims, 52 Drawing Sheets

(56) References Cited

U.S. PATENT DOCUMENTS

| | | | |
|---|---|---|---|
| 5,895,229 A | 4/1999 | Carney et al. |
| 5,998,292 A | 12/1999 | Black et al. |
| 5,998,867 A | 12/1999 | Jensen et al. |
| 6,093,972 A | 7/2000 | Carney et al. |
| 6,150,193 A | 11/2000 | Glenn |
| 6,225,694 B1 | 5/2001 | Terui |
| 6,276,599 B1 | 8/2001 | Ogawa |
| 6,329,631 B1 | 12/2001 | Yueh |
| 6,376,769 B1 | 4/2002 | Chung |
| 6,406,934 B1 | 6/2002 | Glenn et al. |
| 6,448,506 B1 | 9/2002 | Glenn et al. |
| 6,457,633 B1 | 10/2002 | Takashima et al. |
| 6,577,013 B1 | 6/2003 | Glenn et al. |
| 6,586,822 B1 | 7/2003 | Vu et al. |
| 6,614,102 B1 | 9/2003 | Hoffman et al. |
| 6,670,269 B2 | 12/2003 | Mashino |
| 6,686,649 B1 * | 2/2004 | Mathews et al. ............ 257/659 |
| 6,699,787 B2 | 3/2004 | Mashino |
| 6,740,546 B2 | 5/2004 | Corisis et al. |
| 6,740,950 B2 | 5/2004 | Paek |
| 6,740,959 B2 | 5/2004 | Alcoe et al. |
| 6,757,181 B1 | 6/2004 | Villanueva |
| 6,770,955 B1 | 8/2004 | Coccioli et al. |
| 6,781,231 B2 | 8/2004 | Minervini |
| 6,812,549 B2 | 11/2004 | Umetsu et al. |
| 6,815,348 B2 | 11/2004 | Mashino |
| 6,838,776 B2 | 1/2005 | Leal et al. |
| 6,865,084 B2 | 3/2005 | Lin et al. |
| 6,881,896 B2 | 4/2005 | Ebihara |
| 6,962,829 B2 | 11/2005 | Glenn et al. |
| 6,962,869 B1 | 11/2005 | Bao et al. |
| 6,998,532 B2 | 2/2006 | Kawamoto et al. |
| 7,030,469 B2 | 4/2006 | Mahadevan et al. |
| 7,042,398 B2 | 5/2006 | Tang et al. |
| 7,045,385 B2 | 5/2006 | Kim et al. |
| 7,049,682 B1 | 5/2006 | Mathews et al. |
| 7,078,269 B2 | 7/2006 | Yamasaki et al. |
| 7,081,661 B2 | 7/2006 | Takehara et al. |
| 7,125,744 B2 | 10/2006 | Takehara et al. |
| 7,134,198 B2 | 11/2006 | Nakatani |
| 7,157,372 B1 | 1/2007 | Trezza |
| 7,161,252 B2 | 1/2007 | Tsuneoka et al. |
| 7,186,928 B2 | 3/2007 | Kikuchi et al. |
| 7,187,060 B2 | 3/2007 | Usui |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,327,015 B2 | 2/2008 | Yang et al. |
| 7,334,326 B1 | 2/2008 | Huemoeller et al. |
| 7,342,303 B1 | 3/2008 | Berry et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,451,539 B2 | 11/2008 | Morris et al. |
| 7,478,474 B2 | 1/2009 | Koga |
| 7,482,272 B2 | 1/2009 | Trezza |
| 7,488,903 B2 | 2/2009 | Kawagishi et al. |
| 7,504,721 B2 | 3/2009 | Chen et al. |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,576,415 B2 | 8/2009 | Cha et al. |
| 7,598,163 B2 | 10/2009 | Callahan et al. |
| 7,605,463 B2 | 10/2009 | Sunohara |
| 7,625,818 B2 | 12/2009 | Wang |
| 7,629,674 B1 | 12/2009 | Foster |
| 7,633,170 B2 | 12/2009 | Yang et al. |
| 7,633,765 B1 | 12/2009 | Scanlan et al. |
| 7,642,132 B2 | 1/2010 | Huang et al. |
| 7,656,023 B2 | 2/2010 | Sunohara et al. |
| 7,656,047 B2 | 2/2010 | Yang et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,700,411 B2 | 4/2010 | Yang et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,745,910 B1 | 6/2010 | Olson et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang |
| 7,829,981 B2 | 11/2010 | Hsu |
| 7,842,597 B2 | 11/2010 | Tsai |
| 7,868,462 B2 * | 1/2011 | Choi et al. ............ 257/777 |
| 7,944,038 B2 | 5/2011 | Chiu et al. |
| 2002/0017855 A1 | 2/2002 | Cooper et al. |
| 2002/0094605 A1 | 7/2002 | Pai et al. |
| 2004/0020673 A1 | 2/2004 | Mazurkiewicz |
| 2004/0124518 A1 | 7/2004 | Karnezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2004/0259292 A1 | 12/2004 | Beyne et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0189635 A1 | 9/2005 | Humpston et al. |
| 2005/0208702 A1 | 9/2005 | Kim |
| 2005/0258545 A1 | 11/2005 | Kwon |
| 2006/0027632 A1 | 2/2006 | Akram |
| 2006/0145361 A1 | 7/2006 | Yang et al. |
| 2006/0197216 A1 | 9/2006 | Yee |
| 2006/0266547 A1 | 11/2006 | Koga |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0042301 A1 | 2/2008 | Yang et al. |
| 2008/0061407 A1 | 3/2008 | Yang et al. |
| 2008/0174013 A1 | 7/2008 | Yang et al. |
| 2008/0272486 A1 | 11/2008 | Wang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0032928 A1 | 2/2009 | Chiang et al. |
| 2009/0035895 A1 | 2/2009 | Lee et al. |
| 2009/0039527 A1 | 2/2009 | Chan et al. |
| 2009/0102003 A1 | 4/2009 | Vogt et al. |
| 2009/0102033 A1 | 4/2009 | Raben |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |

(56) References Cited

U.S. PATENT DOCUMENTS

| | | |
|---|---|---|
| 2009/0236700 A1 | 9/2009 | Moriya |
| 2009/0243045 A1 | 10/2009 | Pagaila et al. |
| 2009/0256244 A1 | 10/2009 | Liao et al. |
| 2009/0289343 A1 | 11/2009 | Chiu et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0059855 A1 | 3/2010 | Lin et al. |
| 2010/0065948 A1 | 3/2010 | Bae et al. |
| 2010/0073255 A1 | 3/2010 | Noll |
| 2010/0109132 A1 | 5/2010 | Ko et al. |
| 2010/0110656 A1 | 5/2010 | Ko et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0199492 A1 | 8/2010 | Hiner et al. |
| 2010/0207257 A1 | 8/2010 | Lee |
| 2010/0207258 A1 | 8/2010 | Eun et al. |
| 2010/0207259 A1 | 8/2010 | Liao et al. |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0327465 A1 | 12/2010 | Shen et al. |
| 2011/0048788 A1 | 3/2011 | Wang et al. |
| 2011/0068437 A1 | 3/2011 | Chiu et al. |
| 2011/0115057 A1 | 5/2011 | Haru et al. |
| 2011/0115059 A1 | 5/2011 | Lee et al. |
| 2011/0115066 A1 | 5/2011 | Kim et al. |
| 2011/0127654 A1 | 6/2011 | Weng et al. |

FOREIGN PATENT DOCUMENTS

| | | |
|---|---|---|
| JP | 2004228135 A | 8/2004 |
| TW | 200612539 A | 4/2006 |
| WO | WO2004060034 A1 | 7/2004 |

\* cited by examiner

SEMICONDUCTOR PACKAGE INTEGRATED WITH CONFORMAL SHIELD AND ANTENNA

BACKGROUND OF THE INVENTION

1. Field of the Invention

The present invention relates to the field of semiconductor packaging, and, more particularly, to semiconductor packaging in wireless devices.

2. Description of the Related Art

Wireless communication devices, such as cell phones, require antennas for transmitting and receiving signals. Conventionally, a wireless communication device includes therein an antenna and a communication module (e.g., a semiconductor package with RF communication capability), each disposed on different parts of a circuit board. Under the conventional approach, the antenna and the communication module are separately manufactured and electrically connected after being placed on the circuit board. Since separate sets of equipment are separately manufactured, higher manufacturing costs are incurred. Moreover, the conventional approach makes it more difficult to achieve a compact product design.

Furthermore, since antenna signals are high-frequency signals, electromagnetic interference (EMI) may easily occur. EMI may interrupt, obstruct, or otherwise degrade or limit the effective performance of the circuit. As is known in the art, electromagnetic interference protection can be achieved using an electromagnetic interference shielding frame disposed on the circuit board.

SUMMARY OF THE INVENTION

One aspect of the disclosure relates to a semiconductor package. In one embodiment, the semiconductor package comprises a substrate; a semiconductor die disposed on the substrate; a package body encapsulating the semiconductor die; an electromagnetic interference shield formed on the package body; a dielectric structure covering the electromagnetic interference shield; an antenna formed on the dielectric structure; a feeding element connecting the antenna and a feeding point of the substrate; and an antenna grounding element connecting the antenna and the electromagnetic interference shield. In an embodiment the antenna grounding element is disposed within the dielectric structure, and the feeding element penetrates the package body and the dielectric structure. In another embodiment, the antenna grounding element and the feeding element form an extension portion of the antenna on a lateral surface of the dielectric structure. The semiconductor package can also include a grounding frame disposed on the substrate and connecting the substrate and the electromagnetic interference shield. In an embodiment, a dielectric material layer covers the dielectric structure, wherein the permittivity of the dielectric material layer is higher than that of the dielectric structure.

Another aspect of the disclosure relates to a semiconductor package that comprises a semiconductor die, the semiconductor die having an integrated circuit portion and a substrate portion, the integrated circuit portion having an active surface and the substrate portion having an inactive surface; a via extending from the inactive surface and electrically connected to the integrated circuit portion; an electromagnetic interference shield disposed on the inactive surface and electrically connected to the via; a package body encapsulating portions of the die and the electromagnetic interference shield, the package body having an upper surface; a feeding element penetrating the package body and the substrate portion, and electrically connected to the integrated circuit portion; an antenna disposed on the upper surface and electrically connected to the feeding element; and an antenna grounding element disposed within the package body and connecting the antenna and the electromagnetic interference shield. The feeding element comprises a first feeding sub-element and a second feeding sub-element, the first feeding sub-element disposed in the substrate portion, and the second feeding sub-element disposed in the package body. Additionally, a redistribution layer (RDL) is disposed on the active surface and electrically connected thereto.

Another aspect of the disclosure relates to a semiconductor package that comprises a semiconductor die, the semiconductor die having an integrated circuit portion and a substrate portion, the integrated circuit portion having an active surface and the substrate portion having an inactive surface; a first conductive via and a second conductive via, each formed in the die and electrically connected to the integrated circuit portion; an electromagnetic interference shield disposed on the inactive surface and electrically connected to the first conductive via; a dielectric layer disposed on the electromagnetic interference shield, the dielectric layer having an upper surface; a feeding element, wherein the feeding element comprises a first feeding sub-element and a second feeding sub-element, the first feeding sub-element being the second conductive via, and the second feeding sub-element disposed in the package body; an antenna disposed on the upper surface and electrically connected to the feeding element; and an antenna grounding element connecting the antenna and the electromagnetic interference shield.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
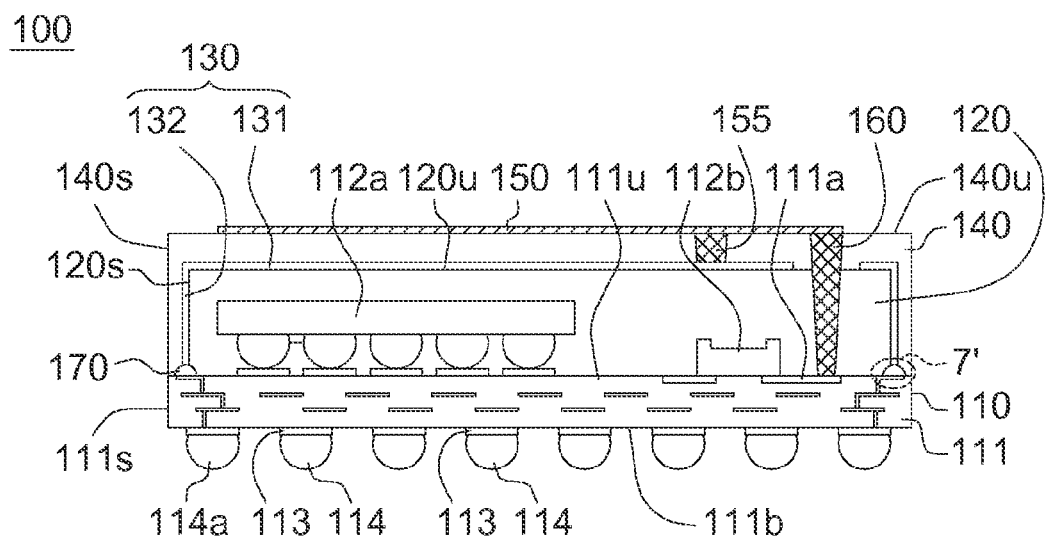
FIG. 1 illustrates a cross-sectional view of a semiconductor package according to an embodiment of the invention.

Referring to FIG. 1 a cross-sectional view of a semiconductor package 100, according to an embodiment of the invention, is illustrated. The semiconductor package 100 includes a, substrate 111, a semiconductor device 112a, a passive element 112b, a package body 120, an electromagnetic interference shielding element 130, a dielectric structure 140, an antenna element 150, a feeding element 160 and an antenna grounding element 155. Advantageously, the semiconductor package 100 of the present embodiment of the invention can be manufactured entirely during a semiconductor packaging process, so that the antenna element 150 is concurrently formed therewith without employing extra antenna manufacturing facilities.

The substrate 111 includes an upper surface 111u, a lower surface 111b opposite to the upper surface 111u, and a lateral surface 111s at a periphery of the substrate 111. The lateral surface 111s extends between the upper surface 111u and the lower surface 111b, and circumscribes the substrate 111. The substrate 111 may be a multi-layered organic substrate or a ceramic substrate, for example.

In this embodiment, the semiconductor device 112a is coupled to the upper surface 111u of the substrate 111 in a "face-down" orientation and electrically connected to the substrate 111 via a plurality of solder balls. This configuration is sometimes referred to as "flip-chip". In other embodiments, the semiconductor device 112a may be coupled to the substrate 111 in a "face-up" orientation, and electrically connected to the substrate 111 via a plurality of conductive bond wires. The passive component 112b can include a resistor, an inductor or a capacitor. Alternatively, the semiconductor device 112a and passive component 112b may be embedded in the substrate 111.

The package body 120 is disposed over the upper surface 111u of the substrate 111 and encapsulates the semiconductor device 112a and the passive component 112b. The package body 120 includes an upper surface 120u and a lateral surface 120s. The material of the package body 120 may include novolac-based resin, epoxy-based resin, silicone-based resin or another suitable encapsulant. The package body 120 may also include suitable fillers such as powdered silicon dioxide. The package body 120 can be formed by various packaging technologies, such as, for example, compression molding, injection molding or transfer molding.

The electromagnetic interference shielding element 130 substantially covers the lateral surface 120s and the upper surface 120u of the package body 120. The electromagnetic interference shielding element 130 includes a first conformal shielding film 131 and a grounding element 132, and provides electromagnetic interference shielding.

The first conformal shielding film 131 is directly formed on the upper surface 120u of the package body 120 and includes an opening. When the antenna element 150 is a patch antenna, the first conformal shielding film 131 can be used as a grounding structure for the antenna element 150. The first conformal shielding film 131 may include aluminum, copper, chromium, tin, gold, silver, nickel, stainless steel or any other suitable metal or alloy.

The grounding element 132 covers the lateral surface 120s of the package body 120 and electrically connects the first conformal shielding film 131 and the substrate 111, wherein the grounding element 132 is a second electromagnetic interference shielding film. The grounding element 132 and the first conformal shielding film 131 can be formed by the same material and integrally formed in one piece in the same manufacturing process or respectively formed in different manufacturing processes. The dielectric structure 140 covers the first conformal shielding film 131 and the grounding element 132 and includes an upper surface 140u. The dielectric structure 140 can be formed by a material such as a package body, a dielectric material (e.g., epoxy), or a prepreg lamination. The lateral surface 140s of the dielectric structure 140 is substantially flush or coplanar with the lateral surface 111s of the substrate 111.

The antenna element 150, formed adjacent to the upper surface 140u of the dielectric structure 140, extends in a direction substantially parallel to the first conformal shielding film 131. The antenna element 150 has several embodiments. The antenna element can be formed on a part of the upper surface of the dielectric structure 140, and the feeding element 160 can be partly or completely overlapped by the antenna element. In addition, the antenna element 150 and the semiconductor device 112a or the passive component 112b can be located on positions at different height levels, so that the required area of the upper surface 111u of the substrate 111 is reduced, and the required dimensions of the entire semiconductor package 100 are reduced.

As illustrated, the antenna grounding element 155 passes through the dielectric structure 140 and electrically connects the antenna element 150 and the electromagnetic interference shielding element 130. As shown, the antenna grounding element 155 passes through the dielectric structure 140 and the package body 120, and the antenna grounding element 155 electrically connects the antenna element 150 and the grounding segment 170. In another embodiment, the antenna grounding element 155 connects the antenna element 150 and a ground potential disposed in the semiconductor package 100. Compared with a design of a semiconductor package without the antenna grounding element 155, the antenna element 150 can be smaller, such that the size of the semiconductor package 100 can be reduced. In one embodiment, the distribution area of the antenna element 150 of the present embodiment can be reduced by 50-75%. The antenna grounding element 155 can be made from a bond wire material and formed using a suitable wire-bonding technique.

The feeding element 160 in the present embodiment of the invention passes through the package body 120 and the dielectric structure 140. The feeding element 160 electrically connects the antenna element 150 and a feeding point 111a of the substrate 111. For example, the feeding element 160 of the present embodiment of the invention can be a conductive pillar disposed in a grounded through hole providing electromagnetic interference protection. The feeding element 160 can also be realized by a conductive film, a conductive layer or a combination of the conductive layer and a resin (e.g., wherein the resin covers the conductive layer and fills up a space surrounded by the conductive layer, as hereinafter described).

The feeding point 111a can be realized by a pad, a solder point, a bump or a wire layer exposed from the substrate 111. The feeding point 111a may be located on the semiconductor device 112a, the passive element 112b or the substrate 111. The feeding element 160 is connected to the feeding point 111a. In the illustrated embodiment, the feeding point 111a is located on the substrate 111 and exposed from the upper surface 111u of the substrate 111.

The grounding segment 170 electrically connects the grounding element 132, and is located on one of the semiconductor device 112a, the passive element 112b and the substrate 111. In the present embodiment of the invention, the grounding segment 170 is located on the substrate 111. The grounding segment 170 can be realized by such as a pad, a solder point, a bump or a wire layer exposed from the substrate 111.

The semiconductor package 100 further includes a pad 113 and an electrical contact 114 disposed on the lower surface 111b, wherein the electrical contact 114, which can be realized by such as a solder ball, a conductive via or a bump, is formed on the pad 113. The electrical contact of the present embodiment of the invention is exemplified by a solder ball, illustrating that the semiconductor package 100 can be a ball grid array (BGA) structure. Alternatively, the electrical contact 114 can be omitted wherein the semiconductor package is a land grid array (LGA) structure. In addition, an electrical contact 114a of the electrical contacts 114 can be realized by such as a grounding contact, which is electrically connected to the grounding segment 170 through the substrate 111. The electrical contact 114a is electrically connected to the ground end of an external circuit element.

Figure 2:
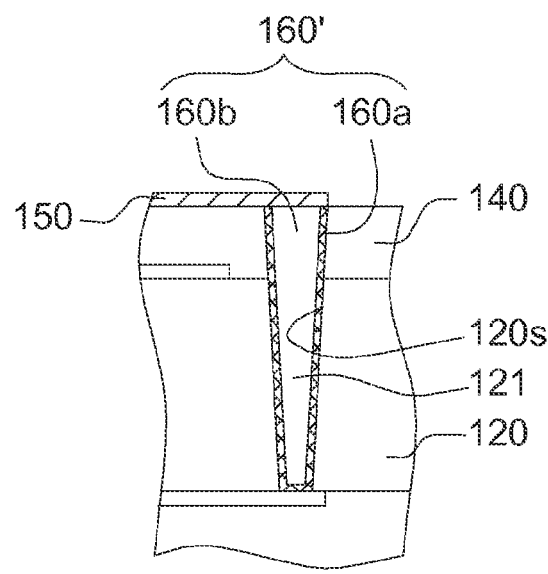
FIG. 2 illustrates a cross-sectional view of a feeding element according to an embodiment of the invention.

Referring to FIG. 2, a cross-sectional view of a feeding element according to another embodiment of the invention is illustrated. The feeding element 160' includes a conductive layer 160a and a resin 160b, wherein the resin 160b covers the conductive layer 160a and fills up the space surrounded by the conductive layer 160a. The package body 120 has a feeding through hole 121. The conductive layer 160a is disposed on the inner wall 120s of the corresponding feeding through hole 121, which passes through the package body 120 and dielectric structure 140. Then, the resin 160b is formed by an appropriate coating technique for covering the conductive layer 160a, and filling up the space surrounded by the conductive layer 160a so as to form the feeding element 160' of FIG. 2. The aforementioned coating technique can be realized by a printing, a plating, a spinning or a spraying process.

Figure 3:
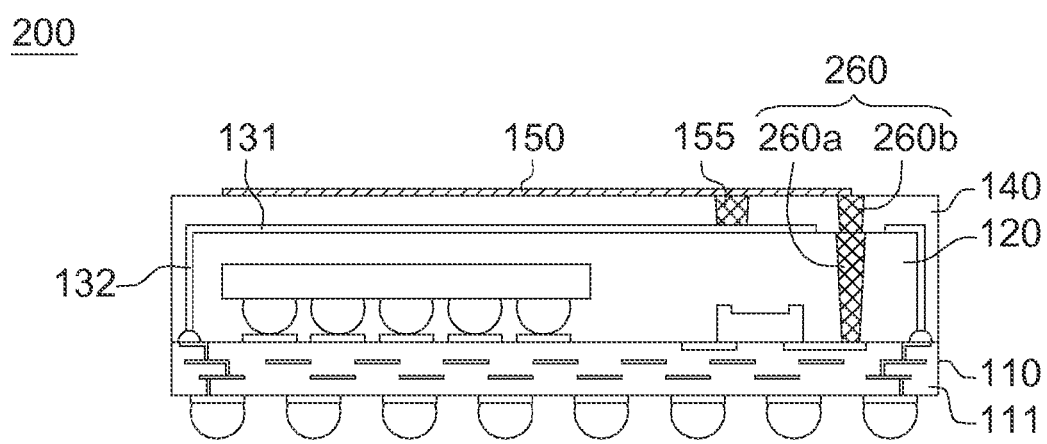
FIG. 3 illustrates a cross-sectional view of a semiconductor package according to an alternative embodiment of the invention.

Referring to FIG. 3, a cross-sectional view of a semiconductor package according to another embodiment of the invention is illustrated. The feeding element 260 of the semiconductor package 200 includes a first feeding sub-element 260a and a second feeding sub-element 260b, wherein the first feeding sub-element 260a passes through the package body 120, while the second feeding sub-element 260b passes through the dielectric structure 140. The first feeding sub-element 260a and the second feeding sub-element 260b can be separately formed in different manufacturing processes. Although the lower end area of the second feeding sub-element 260b is shown substantially smaller than the upper end area of the first feeding sub-element 260, it is to be understood that the lower end area of the second feeding sub-element 260b can be substantially larger than, or substantially equal to, the upper end area of the first feeding sub-element 260.

The first feeding sub-element 260a and the second feeding sub-element 260b can be structurally different. For instance the first feeding element 260a could be realized using a conductive pillar and the second feeding sub-element 260 could be realized using a conductive layer or a combination of a conductive layer and resin (such as how the feeding element shown in FIG. 2 is structured). As another example, the first feeding element 260a could be realized using a conductive layer or a combination of a conductive layer and the second feeding sub-element 260 could be realized using a conductive pillar.

Figure 4:
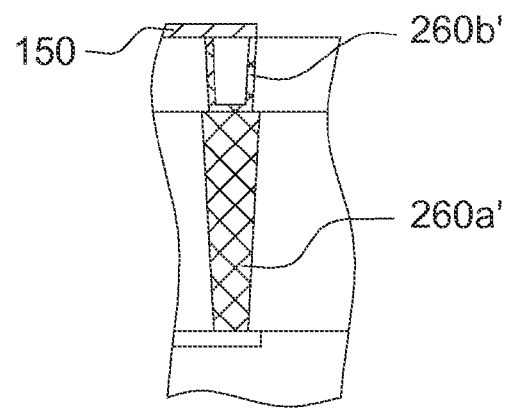
FIG. 4 illustrates a cross-sectional view of a first feeding sub-element and a second feeding sub-element according to an embodiment of the invention.

Referring to FIG. 4, a cross-sectional view of a first feeding sub-element and a second feeding sub-element according to another embodiment of the invention is illustrated. The first feeding sub-element 260a' is a conductive pillar, while the structure of the second feeding sub-element 260b' is similar to that of the feeding element 160' of FIG. 2, which is a combination of the conductive layer and the resin. In addition, the method of forming the first feeding sub-element 260a' is similar to that of the feeding element 160 of FIG. 1, and the method of forming the second feeding sub-element 260b' is similar to that of the feeding element 160' of FIG. 2.

Figure 5:
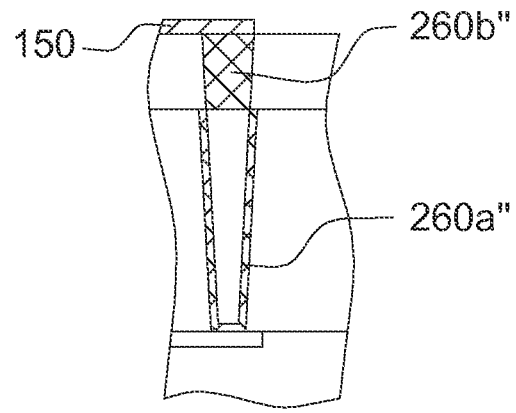
FIG. 5 illustrates a cross-sectional view of a first feeding sub-element and a second feeding sub-element according to an alternative embodiment.

Referring to FIG. 5, a cross-sectional view of a first feeding sub-element and a second feeding sub-element according to another embodiment is illustrated. The structure of the first feeding sub-element 260a" is similar to that of the feeding element 160' of FIG. 2, which is a combination of the conductive layer and the resin. The second feeding sub-element 260b" is a conductive via, and the method of forming the second feeding sub-element 260b" is similar to that of the feeding element 160 of FIG. 1.

Figure 6:
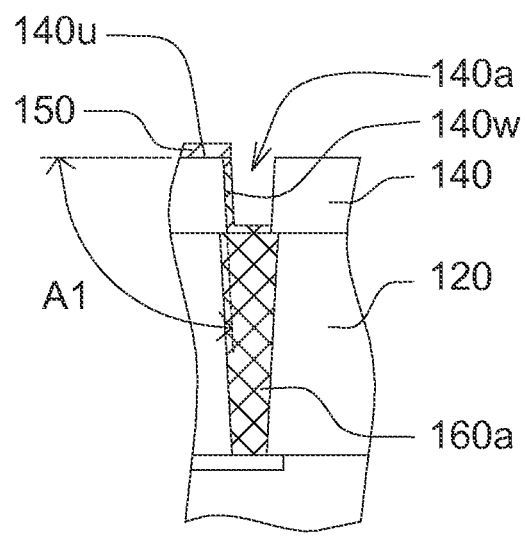
FIG. 6 illustrates a cross-sectional view of a feeding element according to an alternative embodiment of the invention.

Referring to FIG. 6, a cross-sectional view of a feeding element according to another embodiment of the invention is illustrated. The feeding element 160a can be realized by such as a conductive pillar. The dielectric structure 140 has an opening 140a from which the feeding element 160a is exposed and through which the antenna element 150 is connected to the feeding element 160. In the embodiment of FIG. 6, the dielectric structure 140 is a thin-type dielectric structure, so that the thickness is uniform at the bending of the antenna element 150; however, such exemplification not meant to be limiting. In another embodiment, the angle A1 between the inner wall 140w of the opening 140a and the upper surface 140u of the dielectric structure 140 can be increased to increase the slope of the inner wall 140w so that the thickness at the bending of the antenna element 150 is uniform. Moreover, by controlling the width of the opening 140a, the thickness of the antenna element 150 will become more uniform. Preferably but not restrictively, the ratio of the width of the opening 140a to the thickness of the dielectric structure 140 is smaller than or substantially equal to 1.5. For example, if the thickness of the dielectric structure 140 is 0.3 micrometer (um), then the width of the opening 140a ranges between 0.3~0.5 um.

Referring to FIG. 6, the antenna element 150 is connected to the feeding element 160a through the opening 140a, and a bending portion is formed. That is, the antenna element 150 is continuously disposed on the upper surface 140u of the dielectric structure, the inner wall 140w and the upper surface of the feeding element 160a, and the antenna element 150 directly contacts the feeding element 160a. Preferably, but not restrictively, the dielectric structure 140 is realized by a prepreg lamination to form a thinner dielectric structure, so that the thickness of the antenna element 150 at the bending portion is uniform. In another embodiment, despite the dielectric structure 140 not being a thin-type dielectric structure, the thickness of the antenna element 150 at the bending portion still can be uniform by increasing the slope of the inner wall 140w of the opening 140a in the dielectric structure 140.

Figure 7:
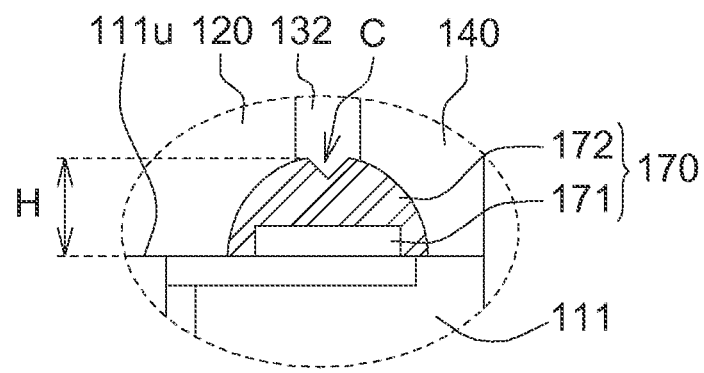
FIG. 7 illustrates an enlargement of the portion 7' of FIG. 1.

Referring to FIG. 7, an enlargement of the portion 7' of FIG. 1 is illustrated. The grounding segment 170 includes a grounding contact 171 and a protruded portion 172. The grounding contact 171 located on the upper surface 111u of the substrate 111 can be realized by a pad electrically connected to the substrate 111. In an embodiment, the grounding contact 171 can be realized by a pad, a solder point, a bump or a wire layer exposed from the substrate 111. The thickness of the grounding contact 171 ranges between 12~18 um or is within another numeric range. The protruded portion 172, realized by such as tin the solder point, covers the grounding contact 171 and is electrically connected to the grounding contact 171.

The protruded portion 172 as illustrated in FIG. 7 has a height H, and the grounding contact 171 will not be cut off by the cutting tool during the manufacturing process. That is, the formation of the protruded portion 172 avoids the grounding contact 171 being separated into two parts. In addition, a cutting tool passes through the protruded portion 172 and an indent C on the protruded portion 172 is formed. The indent C can be V-shaped. However, such exemplification is not meant to be limiting.

Figure 8:
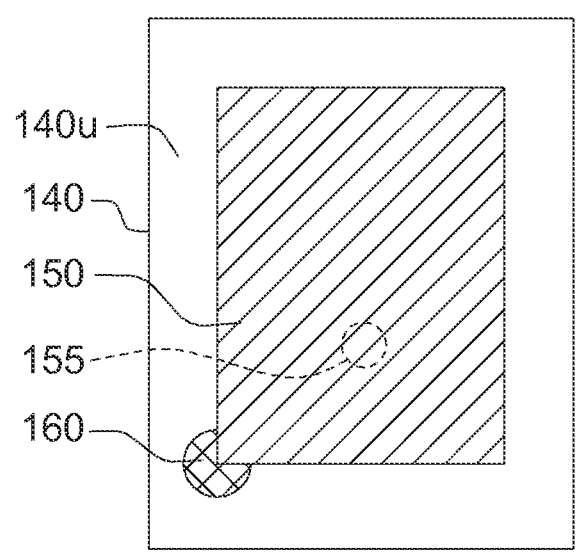
FIGS. 8-14B illustrate top views of an antenna elements according to several embodiments of the invention.

Referring to FIG. 8, a top view of an antenna element according to one embodiment of the invention is illustrated. The antenna element 150 has a rectangular shape and is formed on a part of the upper surface 140u of the dielectric structure 140, while a part of the feeding element 160 is overlapped by the antenna element 150.

Figure 9:
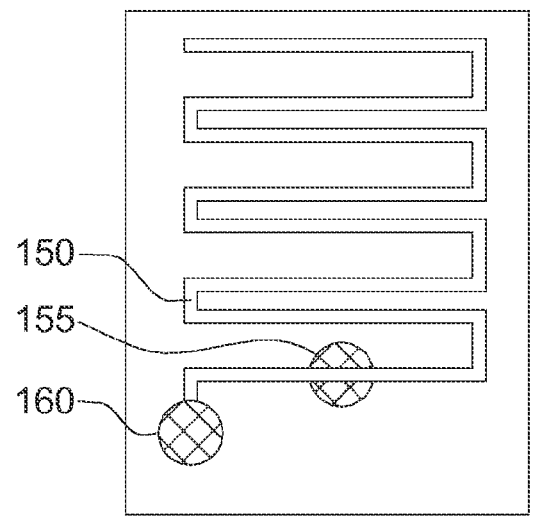

Referring to FIG. 9, the antenna element 150' is formed in a serpentine shape. However, in other embodiments, the antenna element 150' can be formed in one of a spiral structure, a diamond structure and an S-shaped structure. The shape of the antenna element 150 can be designed so that the antenna element 150 has a plurality of excited states.

Figure 10:
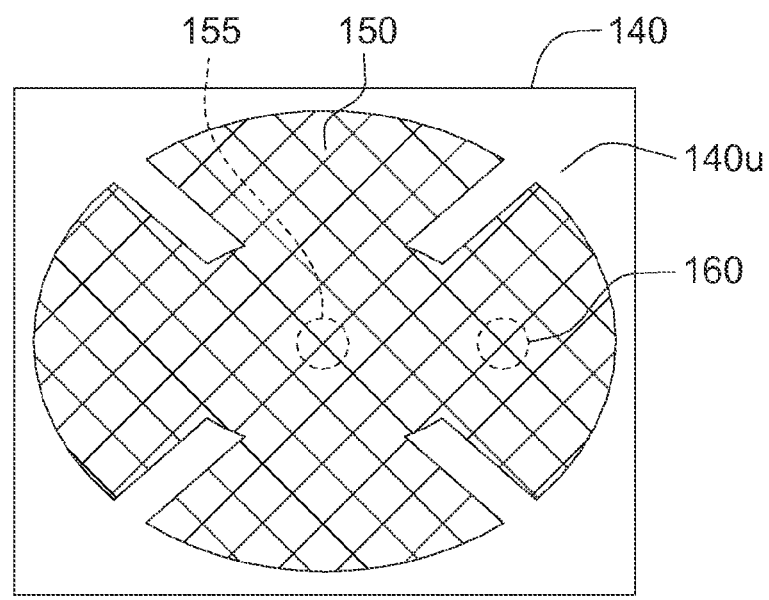

Referring to FIG. 10, the antenna element 150" is a patterned antenna structure formed on a part of the upper surface 140u of the dielectric structure 140, wherein the entire feeding element 160 is overlapped by the antenna element 150. However, the feeding element 160 can be partly overlapped by the antenna element 150. The antenna element 150 in the present embodiment has a dual-band property.

Figure 11:
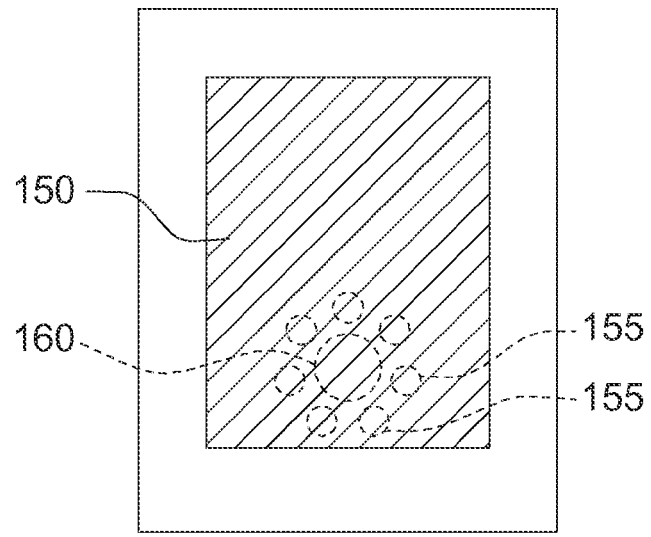

Referring to FIG. 11, the antenna element 150 is formed on a part of the upper surface 140u of the dielectric structure 140, and the entire feeding element 160 is overlapped by the antenna element 150. In addition, the antenna element 150 is formed by applying a metal layer by patterned foil, plating, sputtering or other similar processes. The antenna element 150 can be made from a material including a metal such as aluminum, copper, chrome, tin, gold, silver, nickel, stainless steel, or a combination thereof.

Referring to FIG. 11, to reduce EMI affecting signal quality, a plurality of antenna grounding elements 155 surround the feeding element 160. In other embodiments, fewer or only a single antenna grounding element 155 surround or are otherwise disposed near the feeding element 160.

Figure 12A:
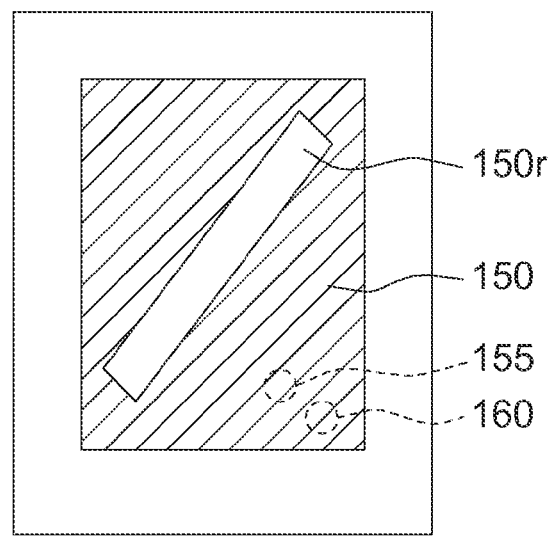

Referring to FIG. 12A, the antenna element 150 is a patterned antenna element and has a slot 150r extending diagonally. In the present embodiment, the slot 150r is a closed slot and does not extend to lateral surfaces of the antenna element 150. The antenna element 150 of the present embodiment may have various patterns, the illustrated embodiment not meant to be limiting. The antenna element 150 in the present embodiment has a dual-band property.

Figure 12B:
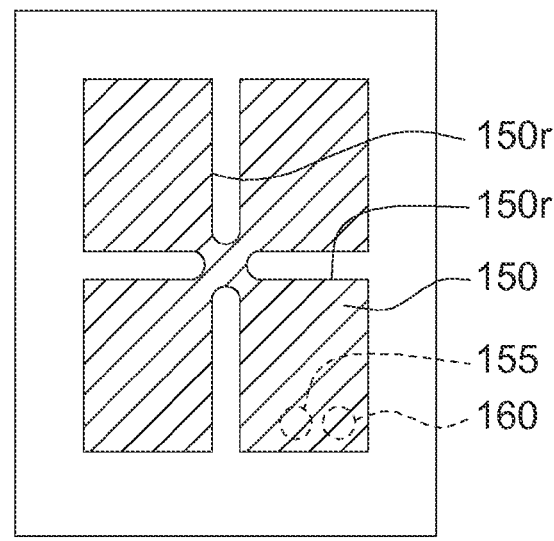

Referring to FIG. 12B, the slot 150r can be an open slot which extends to the lateral surfaces of the antenna element 150. Although only one antenna grounding element 155 is shown in FIG. 12B, it is to be understood that a plurality of antenna grounding elements 155 could be disposed on the antenna element 150. The antenna element 150 in this embodiment also has the dual-band property.

Figure 13A:
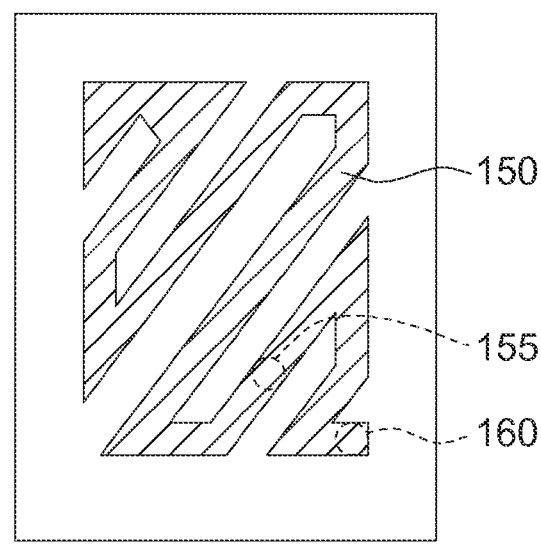
Figure 13B:
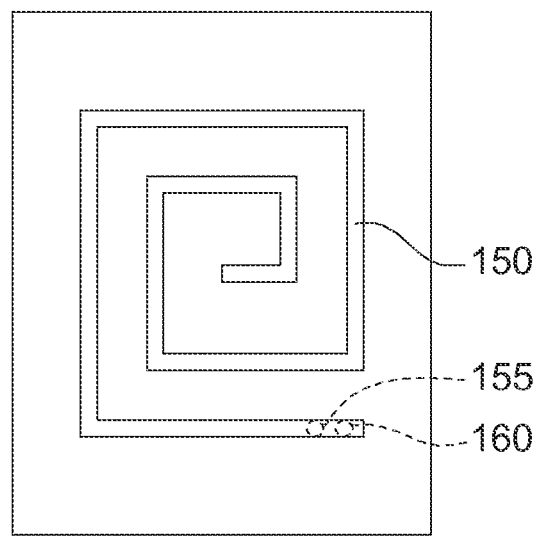

Referring to FIGS. 13A and 13B, the antenna element 150 is a patterned antenna element having a spiral shape or a circuitous shape. The antenna element 150 in the present embodiment has dual-band property.

Figure 14A:
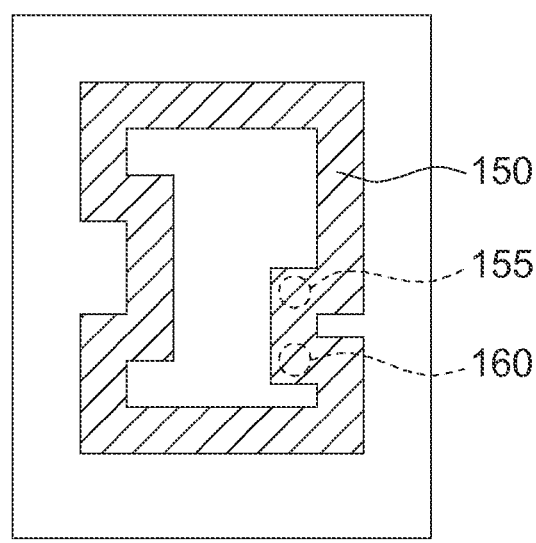

As illustrated in FIG. 14A, the antenna element 150 is a patterned antenna element having a closed ring-shape, adjacent to a periphery of the semiconductor package 100. The antenna element 150 in the present embodiment has a dual-band property.

Figure 14B:
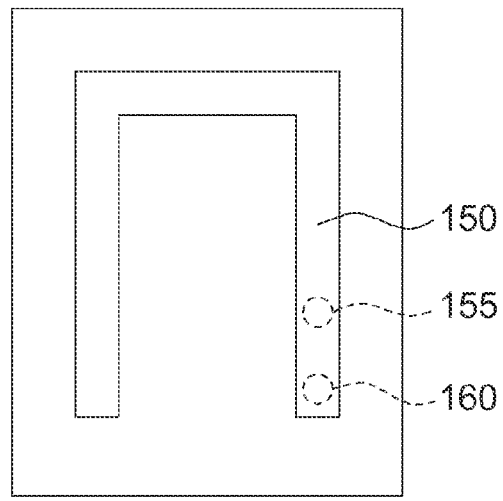

As illustrated in FIG. 14B, the antenna element 150 is a patterned antenna element having an open ring-shape, adjacent to a periphery of the semiconductor package 100. The antenna element 150 in the present embodiment has a dual-band property.

Figure 15:
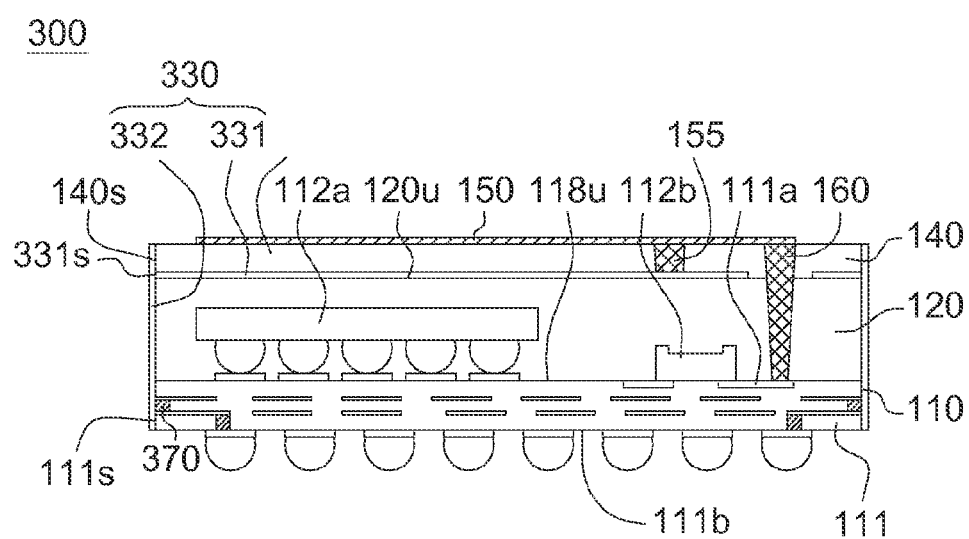
FIG. 15 illustrates a cross-sectional view of a semiconductor package according to an alternative embodiment of the invention.

Referring to FIG. 15, a cross-sectional view of a semiconductor package 300, according to an embodiment of the invention, is illustrated. The semiconductor package 300 includes the substrate 111, the semiconductor device 112a, the passive element 112b, the package body 120, an electromagnetic interference shielding element 330, the dielectric structure 140, the antenna element 150, the feeding element 160 and the antenna grounding element 155. The semiconductor device 112a and the passive element 112b are disposed on the upper surface 111u of the substrate 111 and electrically connected to the substrate 111. The package body 120 encapsulates the semiconductor device 112a and the passive element 112b and has an upper surface 120u. The electromagnetic interference shielding element 330 includes a first conformal shielding film 331 and a grounding element 332.

The grounding element 332, realized by such as a second electromagnetic interference shielding film, covers a lateral surface 120s of the package body 120, the lateral surface 111s of the substrate 111, a lateral surface 140s of the dielectric structure 140 and the lateral surface 331s of the first conformal shielding film 331. In addition, the lateral surface 120s of the package body 120, the lateral surface 111s of the substrate 111 and the lateral surface 140s of the dielectric structure 140 are substantially flush or coplanar with one another.

The semiconductor package 300 further includes a grounding segment 370 disposed in the substrate 111 and exposed from the lateral surface 111s of the substrate 111, so that the grounding element 332 can electrically contact the grounding segment 370. In addition, the lateral surface of the grounding segment 370 is substantially flush or coplanar with the lateral surface 111s of the substrate 111. The grounding segment 370 can be extended between the upper surface 111u and the lower surface 111b of the substrate 111. As illustrated in FIG. 15, the grounding segment 370 is embedded in the substrate 111 and is exposed from the lateral surface 111s of the substrate 111 without penetrating the substrate 111. In an alternative embodiment, the grounding segment 370 can be extended from the upper surface 111u to the lower surface 111b, that is, the grounding segment 370 can penetrate the entire first substrate 111.

Figure 16:
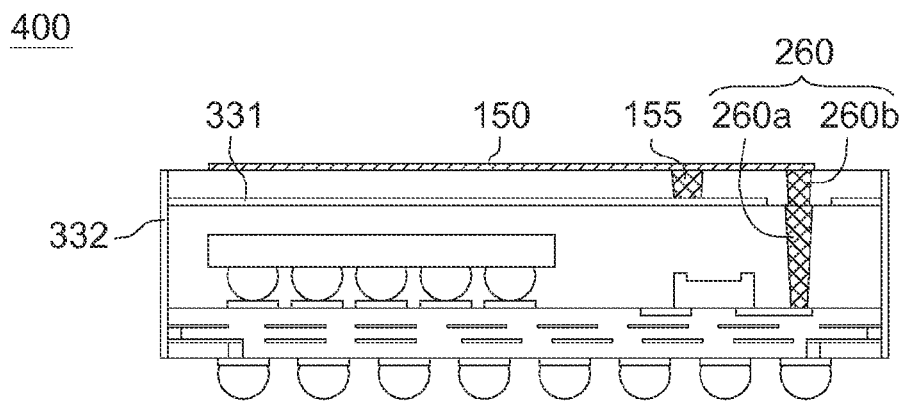
FIG. 16 illustrates a cross-sectional view of a semiconductor package according to an alternative embodiment of the invention.

Referring to FIG. 16, a cross-sectional view of a semiconductor package 400, according to an alternative embodiment of the invention, is illustrated. The feeding element of the semiconductor package 400 is formed as the feeding element 260 illustrated in FIG. 3, that is, the feeding element includes the first feeding sub-element 260a and the second feeding sub-element 260b.

Figure 17:
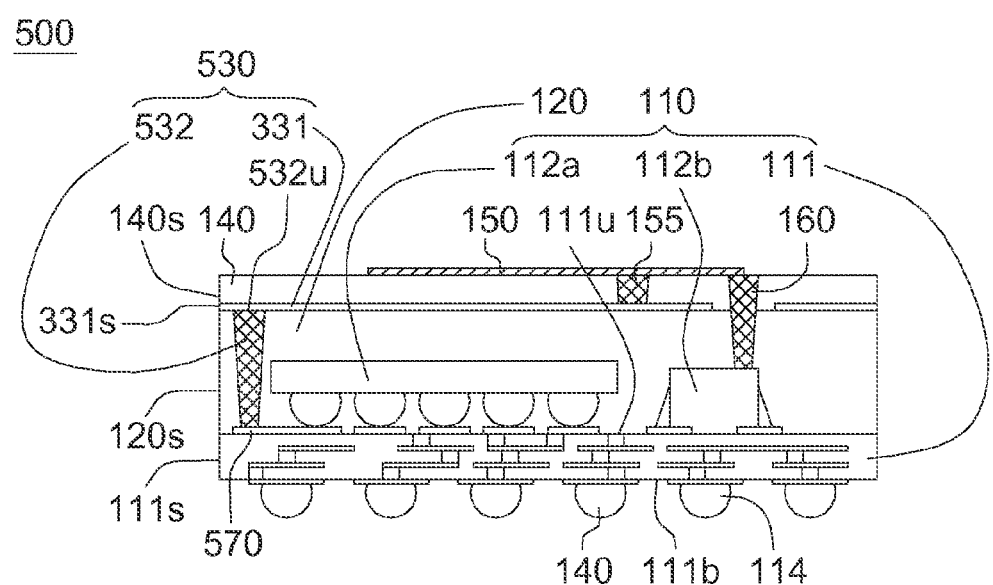
FIG. 17 illustrates a cross-sectional view of a semiconductor package according to an alternative embodiment of the invention.

Referring to FIG. 17, a cross-sectional view of a semiconductor package 500, according to an embodiment of the invention, is illustrated. The semiconductor package 500 includes the first substrate 111, the semiconductor device 112a, the passive element 112b, an electromagnetic interference shielding element 530, the dielectric structure 140, the antenna element 150, the feeding element 160 and the antenna grounding element 155. The semiconductor device 112a and the passive element 112b are disposed on the upper surface 111u of the substrate 111 and electrically connected to the substrate 111. The package body 120 of the semiconductor package 500 encapsulates the semiconductor 112a and the passive element 112b. The electromagnetic interference shielding element 530 includes a first conformal shielding film 331 and a grounding element 532. Alternatively, more than one grounding element 532 can be provided. In that case, the grounding elements 532 may be disposed adjacent to the peripheral of the region in which the semiconductor device 112a is disposed and surrounds the semiconductor device 112a so as to reduce or eliminate electromagnetic radiation.

The grounding element 532 of the semiconductor package 500 passes through the package body 120. The grounding element 532, realized by such as a conductive pillar, electrically connects the first conformal shielding film 331 and the grounding segment 570 on the substrate 111, wherein the grounding segment 570 is exposed from the upper surface 111u of the substrate 111. In the present embodiment of the invention, the first conformal shielding film 331 covers the upper surface 532u of the grounding element 532. In an embodiment, the first conformal shielding film 331 covers a lateral surface of the grounding element 532, while the upper surface 532u of the grounding element 532 is exposed from the first conformal shielding film 331. Alternatively, the grounding element 532 may be a plated via passing through the package body 120 with a conductive layer disposed on the inner wall thereof.

The feeding element 160 of the semiconductor package 500, which may be realized by a conductive pillar, electrically connects the antenna element 150 and the passive component 112b. In an embodiment, the feeding element 160 can also connect the antenna element 150 and the substrate 111, and is thus similar to the feeding element 160 of FIG. 1. Alternatively, the structure of the feeding element 160 of the semiconductor package 500 can also be similar to that of the feeding element of one of FIGS. 2 to 6.

The lateral surface 120s of the package body 120, the lateral surface 111s of the substrate 111, the lateral surface 140s of the dielectric structure 140 and the lateral surface 331s of the first conformal shielding film 331 are substantially flush or coplanar with one another.

Figure 18:
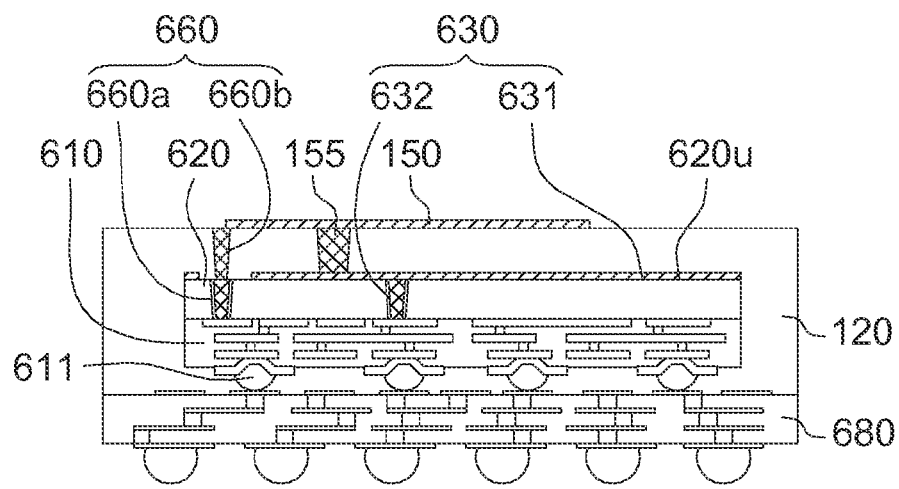
FIGS. 18-25 illustrate cross-sectional views of a semiconductor package according to other embodiments of the invention.

Referring to FIG. 18, a cross-sectional view of a semiconductor package 600, according to another embodiment of the invention, is illustrated. The semiconductor package 600 includes a flip chip type semiconductor die, an electromagnetic interference shielding element 630, a package body 120, an antenna element 150, a feeding element 660 and the antenna grounding element 155. The flip chip type semiconductor die includes an integrated circuit 610 and a silicon substrate 620, wherein the integrated circuit 610 is formed on the silicon substrate 620 and the silicon substrate 620 has an upper surface 620u. The integrated circuit 610 may include one or more transistors, diodes, inductors, capacitors, resistors, and other circuit elements. In addition, a plurality of electrical contacts is formed on contact pads of the integrated circuit 610.

The electromagnetic interference shielding element 630 of the semiconductor package 600 includes a first conformal shield 631 and a grounding element 632. The first conformal shield 631 covers the upper surface 620u of the silicon substrate 620. The grounding element 632 is realized by a through-silicon via (TSV), wherein the through-silicon via can be formed by creating an opening in the silicon substrate 620 and filling the opening with conductive material. The grounding element 632 penetrates the silicon substrate 620, and electrically connects the first conformal shield 631 and the integrated structure 610.

The feeding element 660 penetrates the package body 120 as well as the silicon substrate 620, and electrically connects the antenna element 150 and the integrated circuit 610. As illustrated in FIG. 18, the feeding element 660 includes a first feeding sub-element 660a and a second feeding sub-element 660b. The second feeding sub-element 660b is a conductive via formed in a through-hole disposed in the package body 120. The through-hole is formed by creating an opening in the package body 120, by, for example, laser drilling, and filling the opening with conductive material. The first feeding sub-element 660a is a conductive via formed in a through-hole disposed in the silicon substrate 620. The grounding element 632 and the first feeding sub-element 660a can be concurrently formed in the same manufacturing process. Alternatively, the structure of the feeding element 660 of the semiconductor package 600 can also be similar to that of the feeding element of one of FIGS. 2 to 6.

The package body 120 of the semiconductor package 600 encapsulates the integrated circuit 610 and the silicon substrate 620. The semiconductor package further includes a second substrate 680, which is electrically connected to the integrated circuit 610 through the solder bumps 611. The structure and material of the second substrate 680 are similar to that of the first substrate 111, and the similarities are not repeated here.

Figure 19:
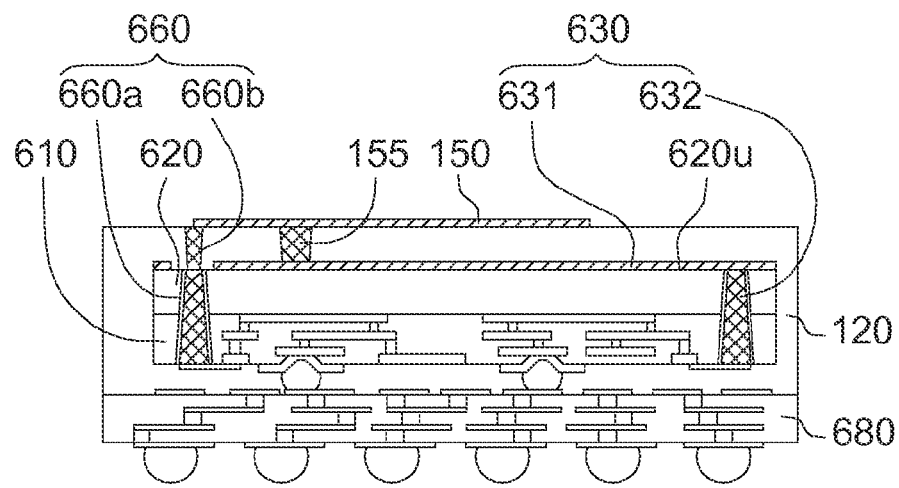

Referring to FIG. 19, a cross-sectional view of a semiconductor package 700, according to another embodiment of the invention, is illustrated. The difference lies in that the grounding element 632 and the feeding element 660 pass through both the integrated circuit 610 and the silicon substrate 620. In addition, the feeding element 660 further passes through the package body 120 and directly contacts the antenna element 150.

Figure 20:
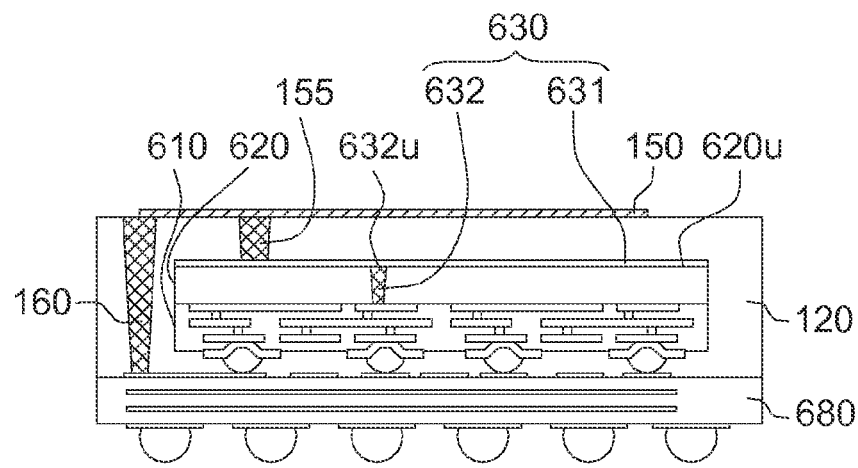

Referring to FIG. 20, a cross-sectional view of a semiconductor package 800, according to another embodiment of the invention, is illustrated. The first conformal shield 631 of the semiconductor package 800 covers the upper surface 620u of the silicon substrate 620 and directly contacts the upper surface 632u of the grounding element 632. In an embodiment, the upper surface 632u of the grounding element 632 may be exposed from the first conformal shield 631, instead of being covered by the first conformal shield 631. The feeding element 160 passes through the package body 120 and electrically connects the antenna element 150 and the integrated circuit 610 through the circuit layout of second substrate 680. Alternatively, the structure of the feeding element 160 of the semiconductor package 800 may also be similar to that of one of the feeding element shown in FIGS. 2 to 6.

Figure 21:
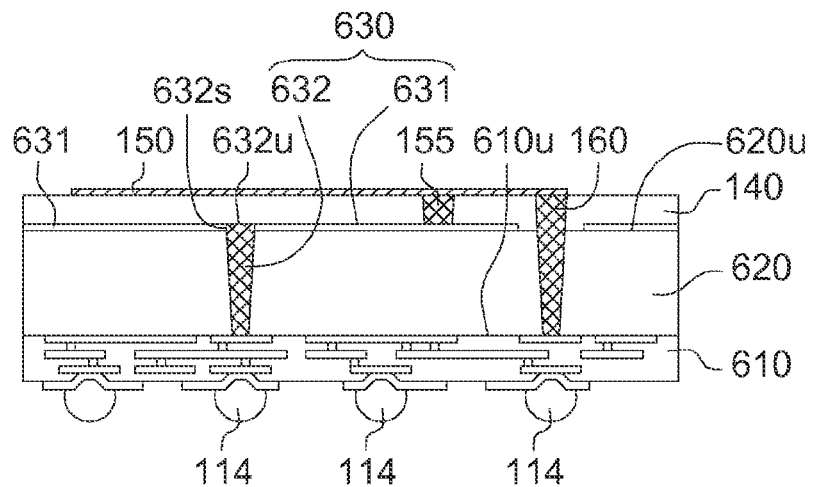

Referring FIG. 21, a cross-sectional view of a semiconductor package 900, according to another embodiment of the invention, is illustrated. The semiconductor package 900 includes an integrated circuit 610, a silicon substrate 620, an electromagnetic interference shielding element 630, a dielectric structure 140, an antenna element 150, a feeding element 160 and the antenna grounding element 155. The semiconductor package 900 of the present embodiment of the invention can be realized by a semiconductor wafer level chip scale package (WLCSP) integrated with an antenna structure, wherein the integrated circuit 610 may include one or more transistors, diodes, inductors, capacitors, resistors, and other circuit elements. As illustrated in FIG. 21, the semiconductor package 900 further includes a plurality of solder bumps, wherein the solder bumps may be connected to the integrated circuit 610 through contact pads or through a redistribution layer.

The electromagnetic interference shielding element 630 includes a first conformal shield 631 and a grounding element 632. The grounding element 632 can be realized by a conductive through-silicon via (TSV), electrically connecting the first conformal shield 631 and the integrated circuit 110. That is, the grounding element 632 can be formed by creating an opening in the silicon substrate 620 and filling the opening with conductive material, wherein the opening extends from the upper surface 620u of the silicon substrate 620 to a surface of the silicon substrate 620 (the surface with the integrated circuit formed thereon). In the present embodiment of the invention, the first conformal shield 631 electrically contacts a lateral surface 632s of the grounding element 632, and the upper surface 632u of the grounding element 632 is exposed from the first conformal shielding film 631. That is, the first conformal shield 631 does not cover the upper surface 632u of the grounding element 632. In an embodiment, the first conformal shield 631 may cover a part of the upper surface 632u of the grounding element 632. The feeding element 160 passes through both the package body 120 and the silicon substrate 620 to electrically connect the antenna element 150 and the integrated circuit 110. Alternatively, the structure of the feeding element 160 of the semiconductor package 800 may also be similar to that of the feeding element of one of FIGS. 2 to 6. In addition, the dielectric structure 140 covers the upper surface 620u of the silicon substrate 620.

Figure 22:
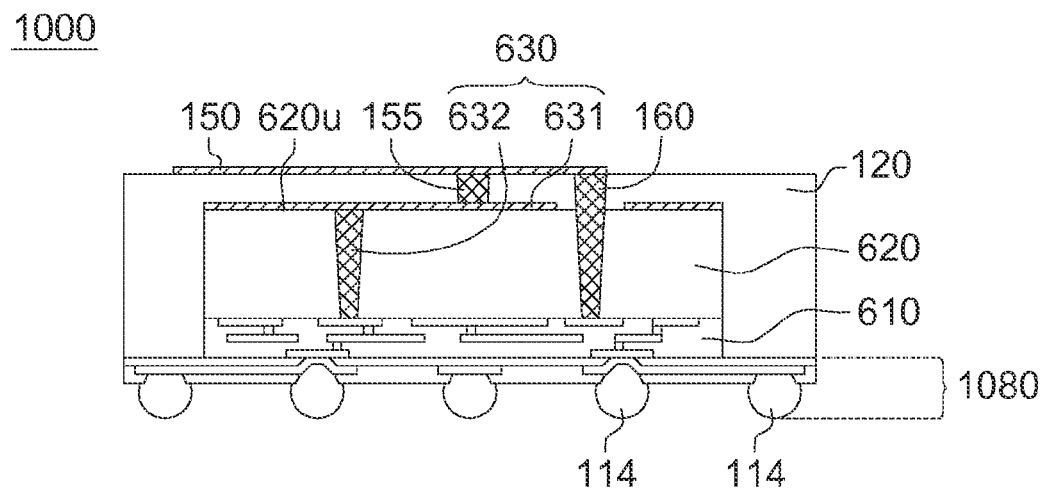

Referring to FIG. 22, a cross-sectional view of a semiconductor package 1000, according to another embodiment of the invention, is illustrated, wherein the semiconductor package 1000 is a fan-out wafer level package (FOWLP). The semiconductor package 1000 includes a semiconductor die, an electromagnetic interference shielding element 630, a package body 120, an antenna element 150, a feeding element 160 and the antenna grounding element 155. The semiconductor die includes an integrated circuit 610 and a silicon substrate 620, wherein the integrated circuit 610 may include one or more transistors, diodes, inductors, capacitors, resistors, and other circuit elements.

The electromagnetic interference shielding element 630 includes a first conformal shield 631 and a grounding element 632. The first conformal shield 631 covers the upper surface 620u of the silicon substrate 620. The semiconductor package 1000 further includes a redistribution layer 1080 electrically connected to the integrated circuit 610. The redistribution layer 1080 is formed after the integrated circuit 610 and the silicon substrate 620 are encapsulated by the package body 120. Therefore, the package body 120 encapsulates the integrated circuit 610, the silicon substrate 620 and a part of the redistribution layer 1080.

Figure 23:
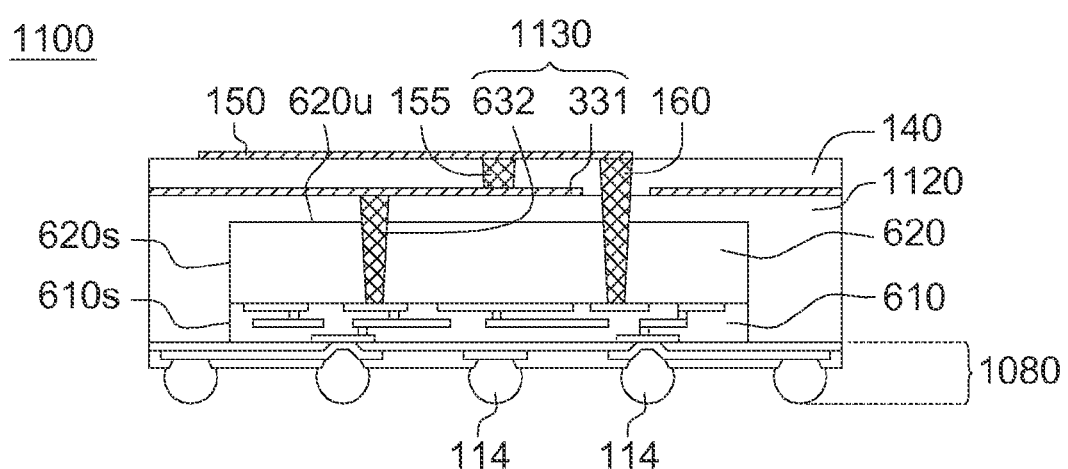

Referring to FIG. 23, a cross-sectional view of a semiconductor package 1100, according to another embodiment of the invention, is illustrated. The semiconductor package 1100 may be a fan-out wafer level package (FOWLP). The semiconductor package 1100 includes a semiconductor die, an electromagnetic interference shielding element 1130, a dielectric structure 140, an antenna element 150, a feeding element 160 and the antenna grounding element 155. The semiconductor die includes an integrated circuit 610 and a silicon substrate 620, wherein the integrated circuit 610 may include one or more transistors, diodes, inductors, capacitors, resistors and other circuit elements. The semiconductor package 1100 further includes a package body 1120, which covers the upper surface 620u and a lateral surface 620s of the silicon substrate 620 as well as a lateral surface 610s of the integrated circuit 610.

The electromagnetic interference shielding element 1130 includes a first conformal shielding film 331 and a grounding element 632, wherein the first conformal shielding film 331 is formed on the package body 1120 and covered by the dielectric structure 140. The grounding element 632 is a conductive through-hole disposed in the package body 1120 and extending from the upper surface 620u of the silicon substrate 620 to the other surface (the surface with the integrated circuit 610 formed thereon) of the silicon substrate 620. That is, the grounding element 632 passes through the package body 1120 and the silicon substrate 620 to electrically connect the first conformal shielding film 331 and the integrated circuit 610.

The feeding element 160 passes through the dielectric structure 140, the package body 1120 and the silicon substrate 620 to electrically connect the antenna element 150 and the integrated circuit 610, wherein the feeding element 160 directly contacts the antenna element 150. Alternatively, the structure of the feeding element 160 of the semiconductor package 1100 can be similar one of the feeding element shown in FIGS. 2 to 6.

Figure 24:
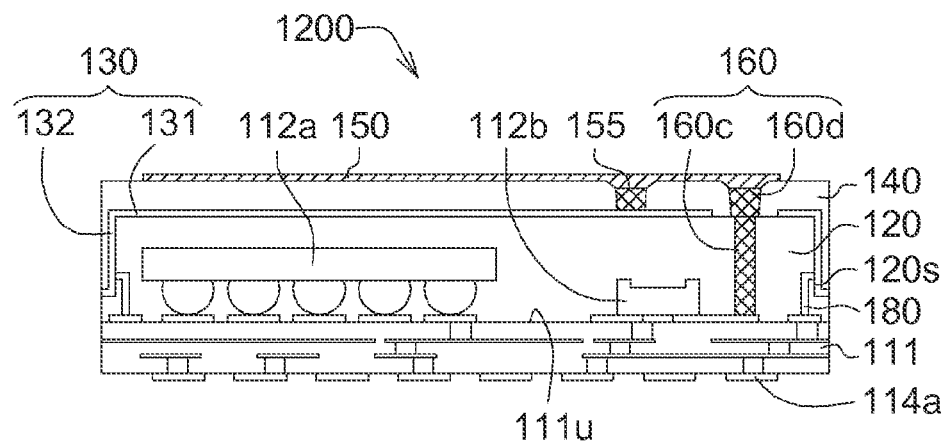

Referring to FIG. 24, a cross-sectional view of a semiconductor package 1200, according to another embodiment of the invention, is illustrated. The semiconductor package 1200 includes the substrate 111, the semiconductor device 112a, the passive element 112b, the package body 120, the electromagnetic interference shielding element 130, the dielectric structure 140, the antenna element 150, the feeding element 160, the antenna grounding element 155, and the grounding frame 180.

The electromagnetic interference shielding element 130 covers an outer surface 120s of the package body 120 and an outer surface of the grounding frame 180 exposed from the outer surface 120s of the package body 120. The ground path for the electromagnetic interference shielding element 130 includes the grounding frame 180, interconnections in the substrate 111 and the electrical contact 114a which is connected to an external ground point to improve shielding effectiveness.

The antenna element 150 is formed on the dielectric structure 140, and electrically connects the feeding element 160 and the feeding point 111a of the substrate 111. The antenna element 150 is made from a material such as a bond wire material formed by a wire-bonding technique. In another embodiment, the structure of the antenna grounding element 155 is similar to the feeding element 160' or 260b' as described above.

The feeding element 160 includes a first feeding sub-element 160c and a second sub-element 160d. The first feeding sub-element 160c in the package body 120 is electrically connected to the substrate 111, and the second sub-element 160d in the dielectric structure 140 is connected to first feeding sub-element 160c. The first feeding sub-element 160c and the second feeding sub-element 160d are made from a material such as a bond wire material formed by a wire-bonding technique.

The grounding frame 180 is disposed on an upper surface 111u of the substrate 111 and electrically connected to the electrical contact 114a (grounding contact) through the interconnections in the substrate 111.

Figure 25:
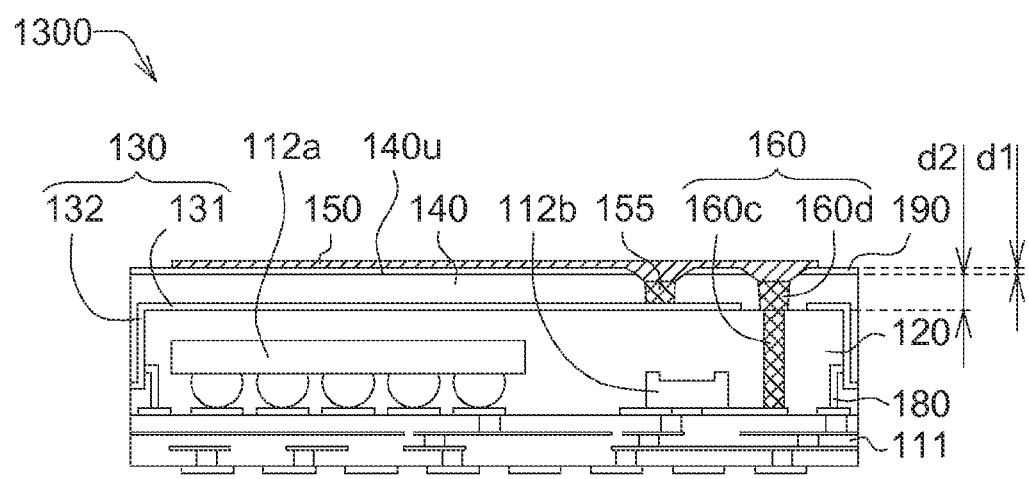

Referring to FIG. 25, a cross-sectional view of a semiconductor package 1300, according to another embodiment of the invention, is illustrated. The semiconductor package 1300 includes the substrate 111, the semiconductor device 112a, the passive element 112b, the package body 120, the electromagnetic interference shielding element 130, the dielectric structure 140, the antenna element 150, the feeding element 160, the antenna grounding element 155, the grounding frame 180, and a dielectric material layer 190.

The dielectric material layer 190 is formed on an upper surface 140u of the dielectric structure 140. Where the permittivity of the dielectric structure 140 is lower than desired, the dielectric material layer 190 can be formed to increase the total permittivity of the dielectric material layer 190 and the dielectric structure 140 to the desired level. The permittivity $\varepsilon r1$ of the dielectric material layer 190 can be considerably higher than the permittivity $\varepsilon r2$ of the dielectric structure 140 (e.g., permittivity $\varepsilon r1$ is 2-100 times as large as the permittivity $\varepsilon r2$). The equivalent permittivity $\varepsilon$ of the dielectric material layer 190 and the dielectric structure 140 can be calculated using the formula (1) below.

$$\varepsilon = \frac{d1 + d2}{\left(\frac{d1}{\varepsilon r1} + \frac{d2}{\varepsilon r2}\right)} \quad (1)$$

The dielectric material layer 190 can be made from a material with high permittivity, such as, for example, ceramics material such as aluminum oxide or silicon dioxide.

As illustrated in FIG. 25, the thickness d1 of the dielectric material layer 190 is less than the thickness d2 of the dielectric structure 140. The thickness d1 can range between 5%~90% of the thickness d2 of the dielectric structure 140, for example. In another embodiment, the thickness d1 of the dielectric material layer 190 is thicker than the thickness d2 of the dielectric structure 140. In comparison with a higher equivalent permittivity, a lower equivalent permittivity allows the distribution area of the antenna element 150 to be less and the size of the semiconductor package reduced. The permittivity depends on considerations including the antenna impedance.

Figure 26A:
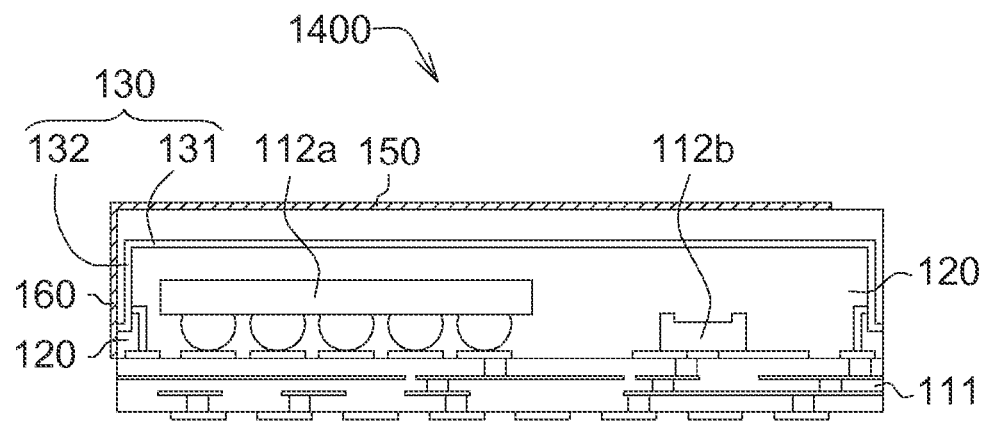
FIG. 26A illustrates a cross-sectional view of a semiconductor package according to another embodiment of the invention.

Referring to FIG. 26A, a cross-sectional view of a semiconductor package 1400, according to another embodiment of the invention, is illustrated. The semiconductor package 1400 includes the substrate 111, the semiconductor device 112a, the passive element 112b, the package body 120, the electromagnetic interference shielding element 130, the dielectric structure 140, the antenna element 150, the feeding element 160, the antenna grounding element 155, and the grounding frame 180.

Figure 26B:
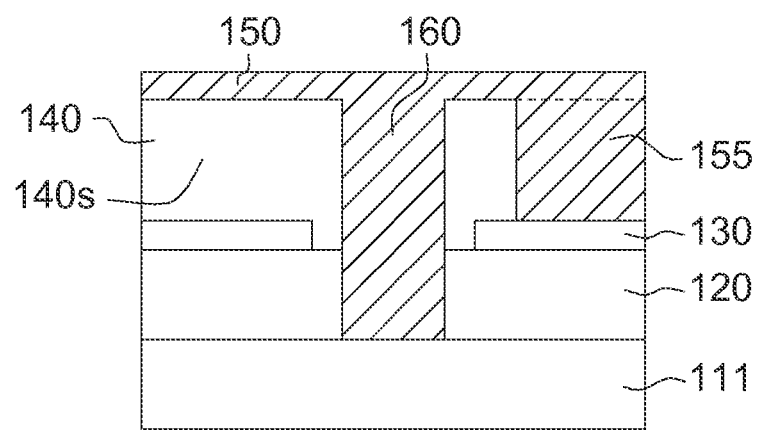
FIG. 26B illustrates a side view of FIG. 26A.

Referring to FIG. 26B, a side view of FIG. 26A is illustrated. The antenna grounding element 155 is formed on a lateral surface 140s of the dielectric structure 140 and the electromagnetic interference shielding element 130 to be electrically connected to the electrical contact 114a (grounding contact). The feeding element 160 is formed on a lateral surface of the dielectric structure 140 and extended to the feeding point 111a (not illustrated) of the substrate 111. That is, in the present embodiment, the antenna grounding element 155 and the feeding element 160 are extension portions of the antenna element 150, which is a layer structure extended on the lateral surface of the semiconductor package 100. The antenna grounding element 155, the feeding element 160 and the antenna element 150 can be formed in the same manufacture process.

Referring to FIGS. 27A-27I, manufacturing processes according to the semiconductor package 100 of FIG. 1 are illustrated.

Figure 27A:
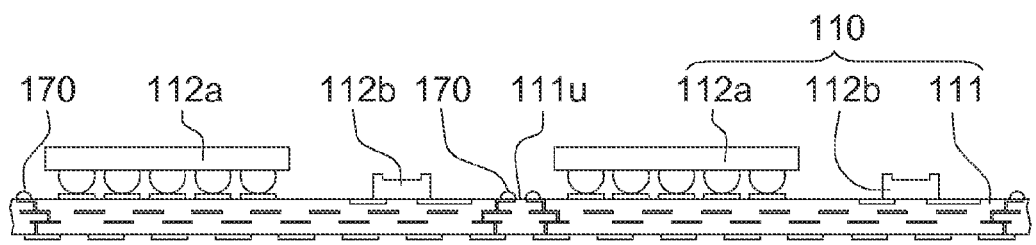
FIGS. 27A-27I illustrate manufacturing processes according to the semiconductor package of FIG. 1.

Referring to FIG. 27A, a semiconductor device 112a and passive component 112b are disposed adjacent to the upper surface 111u of the first substrate 111 using, for example, surface mount technology (SMT). The first substrate 111 includes a grounding segment 170.

Figure 27B:
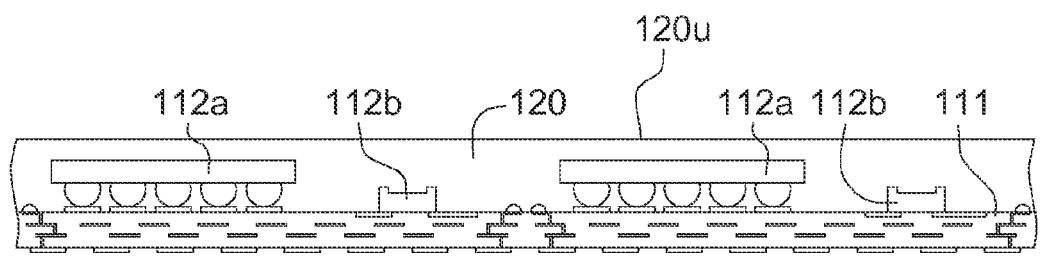

Referring to FIG. 27B, a package body 120 encapsulating the semiconductor element is formed on the upper surface 111u of the first substrate 111, wherein the package body 120 has an upper surface 120u.

Figure 27C:
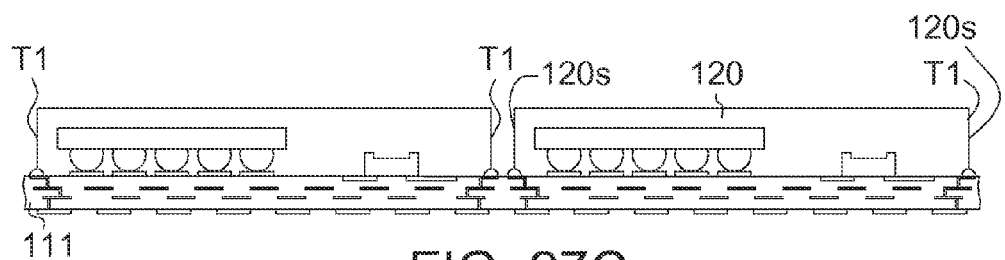

Referring to FIG. 27C, a first singulation path T1 is formed, wherein the first singulation path T1 passes through the package body 120. The first singulation paths T1 is formed using an appropriate laser or other cutting tool, and a lateral surface 120s is thereupon formed on the package body 120. In an embodiment, the first singulation path T1 may pass through a part of the first substrate 111. In the present embodiment of the invention, the singulation method is a half-cut method, that is, the first singulation path T1 does not cut off the first substrate 111.

Figure 27D:
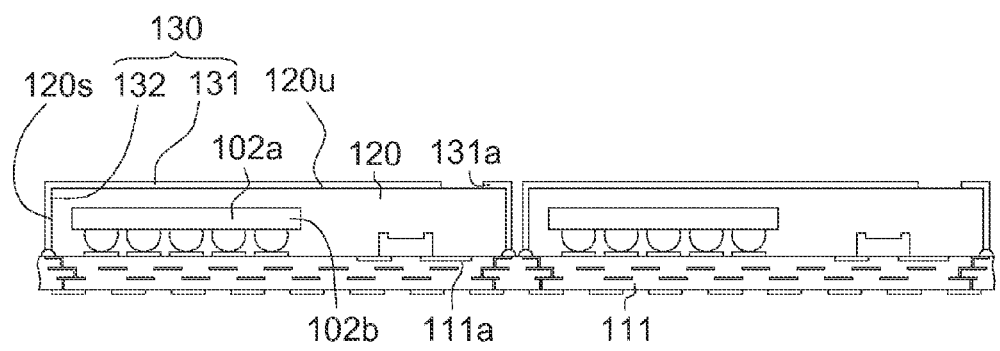

Referring to FIG. 27D, an electromagnetic interference shielding element 130, including a first conformal shielding film 131 and a grounding element 132, is formed. The electromagnetic interference shielding element 130 can be realized by material formation technology such as chemical vapor deposition, electroless plating, electrolytic plating, printing, spinning, spraying, sputtering, or vacuum deposition. In the present embodiment of the invention, the first conformal shielding film 131 and the grounding element 132 are integrally formed in one piece in the same manufacturing process. However, such exemplification is not meant to be limiting.

In FIG. 27D, the first conformal shielding film 131 covers the upper surface 120u of the package body 120. The first conformal shielding film 131 has an opening 131a from which a part of the package body 120 is exposed. The position of the opening 131a corresponds to the feeding point 111a, that is, the opening 131a is located right above the feeding point 111a. In the present embodiment of the invention, the feeding point 111a is formed adjacent to the upper surface 111u of the first substrate 111. In an embodiment, the feeding point 111a can also be located in the semiconductor device 112a or the passive component 112b. The grounding element 132 is a second electromagnetic interference shielding film, which is connected to the first conformal shielding film 131 and the grounding segment 170 and covers a lateral surface 120s of the package body 120.

Figure 27E:
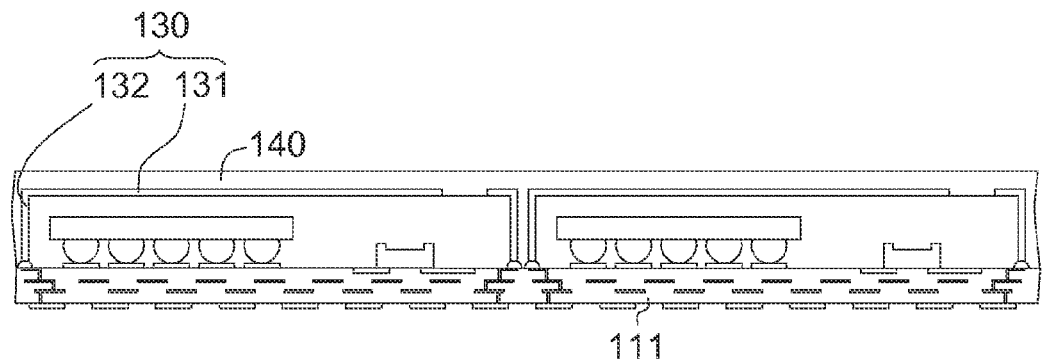

Referring to FIG. 27E, a dielectric structure 140 covering the first conformal shielding film 131, the grounding element 132 and the exposed upper surface of the first substrate 111 is formed. The dielectric structure 140 may be formed using any known packaging technology or laminate technology.

Figure 27F:
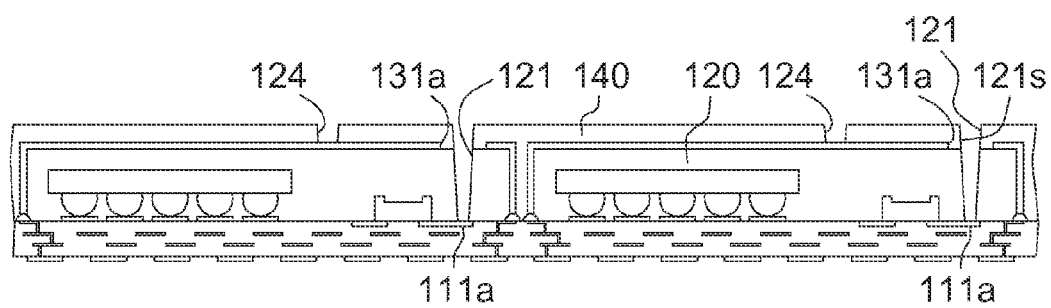

Referring to FIG. 27F, a feeding through hole 121 penetrating the package body 120 and the dielectric structure 140 and an antenna grounding through hole 124 penetrating the dielectric structure 140 are formed. The feeding through hole 121 passes through the dielectric structure 140, the opening 131a and the package body 120, and the feeding through hole 121 exposes the feeding point 111a. The patterning technology for forming the feeding through hole 121 can include photolithography, chemical etching, laser drilling, or mechanical drilling. The antenna grounding through hole 124 exposes the first conformal shielding film 131.

Figure 27G:
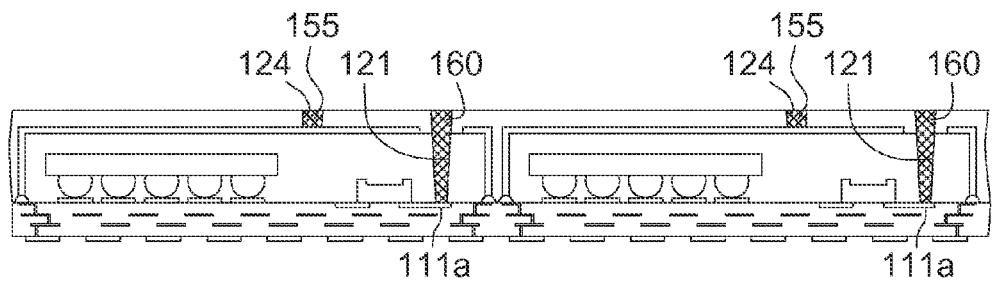

Referring to FIG. 27G, a feeding element 160 is formed by filling the feeding through hole 121 with conductive material by plating, solder paste or other forms of applying conductive material. The feeding element 160 extends from the upper surface 140u of the dielectric structure 140 and is electrically connected to the feeding point 111a. In addition, an antenna grounding element 155 is formed by filling the antenna grounding through hole 124 with conductive material by plating solder paste or other forms of applying conductive material, wherein, the antenna grounding element 155 contacts the first conformal shielding film 131.

Figure 27H:
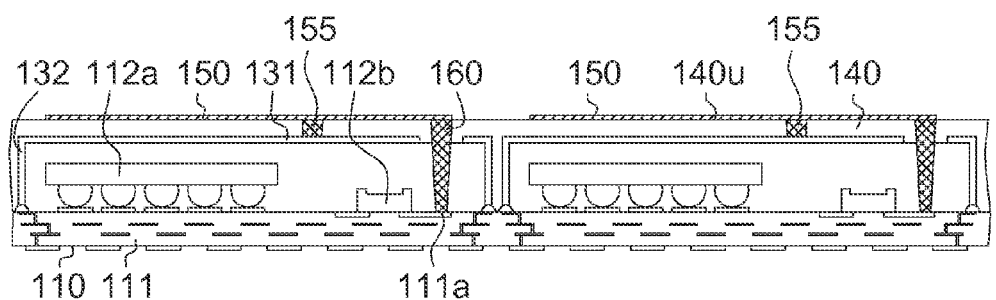

Referring to FIG. 27H, an antenna element 150 is formed on the upper surface 140u of the dielectric structure 140 and directly contacts the feeding element 160 and the antenna grounding element 155, so that the antenna element 150 electrically connects the circuit structure 110 through the feeding element 160 and electrically connects the grounding segment 170 through the antenna grounding element 155. The antenna element 150 can be formed as described above to include plating/etching photolithographic processes.

Figure 27I:
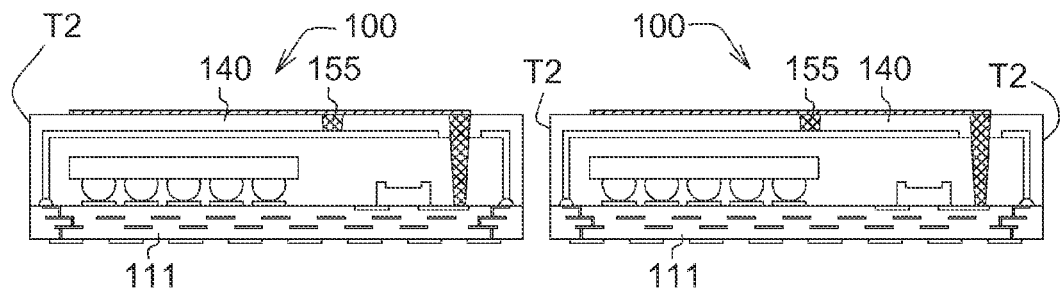

Referring to FIG. 27I, a number of second singulation paths T2 passing through the dielectric structure 140 and the entire first substrate 111 are formed. For example, a second singulation path T2 is formed by such as a laser or other cutting tool. In addition, before or after the second singulation path T2 is formed, an electrical contact 114 may be formed adjacent to the lower surface 111b of the first substrate 111 so as to form the semiconductor package 100 illustrated in FIG. 1.

Referring to FIGS. 28A-28D, manufacturing processes according to the semiconductor package of FIG. 3 are illustrated.

Figure 28A:
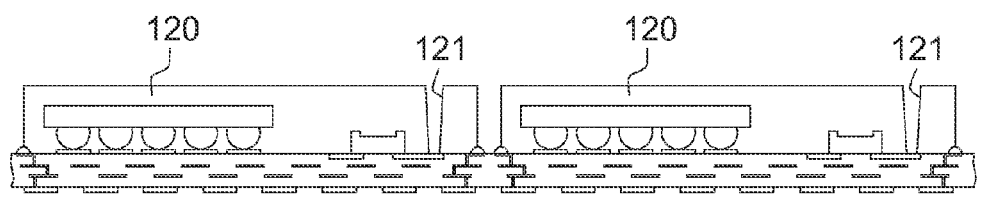
FIGS. 28A-28D illustrate manufacturing processes according to the semiconductor package of FIG. 3.

Referring to FIG. 28A, a feeding through hole 121 penetrating the package body 120 is formed.

Figure 28B:
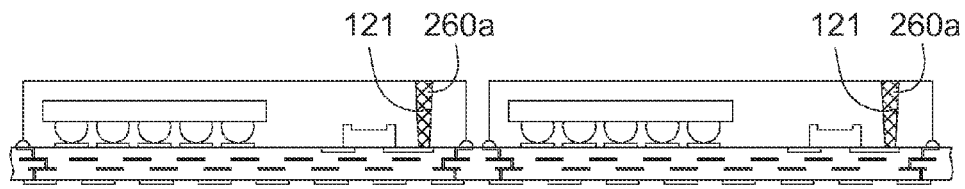

Referring to FIG. 28B, a first feeding sub-element 260a is formed by filling the feeding through hole 121 with conductive material.

Figure 28C:
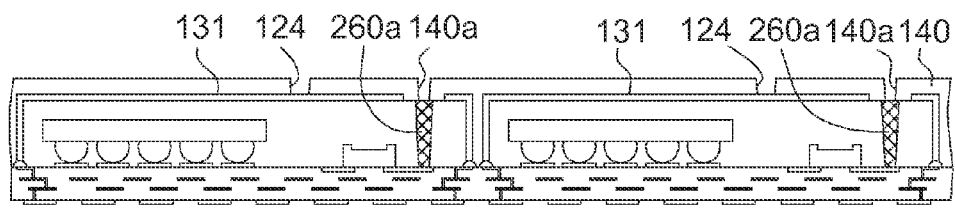

Referring to FIG. 28C, an electromagnetic interference shielding element 130 and a dielectric structure 140 are formed, and an opening 140a and an antenna grounding through hole 124 are formed on the dielectric structure 140, wherein the opening 140a exposes a corresponding first feeding sub-element 260a, and the antenna grounding through hole 124 exposes a first conformal shielding film 131.

Figure 28D:
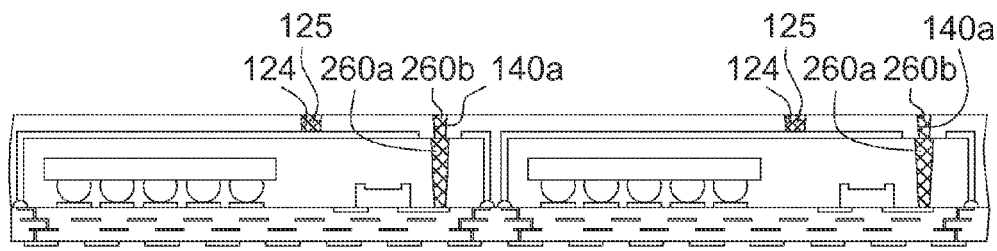

Referring to FIG. 28D, a second feeding sub-element 260b and an antenna grounding element 155 are formed by filling respectively the corresponding opening 140a and the antenna grounding through hole 124 with conductive material, wherein the first feeding sub-element 260a and the second feeding sub-element 260b are combined as the feeding element 260 of FIG. 3.

Referring to FIGS. 29A~29F, manufacturing processes according to the semiconductor package of FIG. 15 are illustrated. The present embodiment of the invention adopts the full-cut method.

Figure 29A:
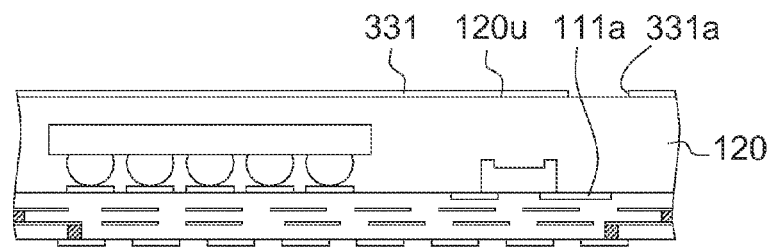
FIGS. 29A-29F illustrate manufacturing processes according to the semiconductor package of FIG. 15.

Referring to FIG. 29A, a first conformal shielding film 331 is formed on the upper surface 120u of the package body 120. The first conformal shielding film 331 has an opening 331a from which a part of the package body 120 is exposed, wherein the position of the opening 331a corresponds to the feeding point 111a.

Figure 29B:
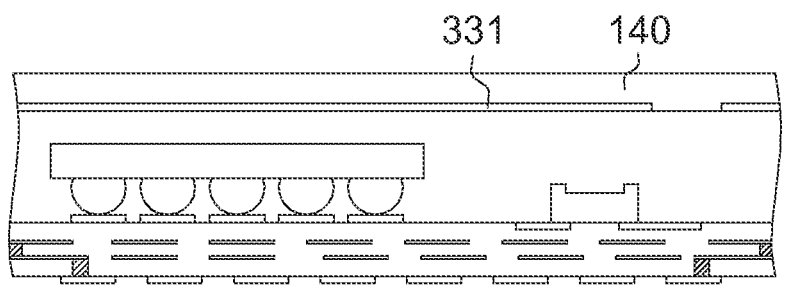

Referring to FIG. 29B, a dielectric structure 140 covering the first conformal shielding film 331 is formed.

Figure 29C:
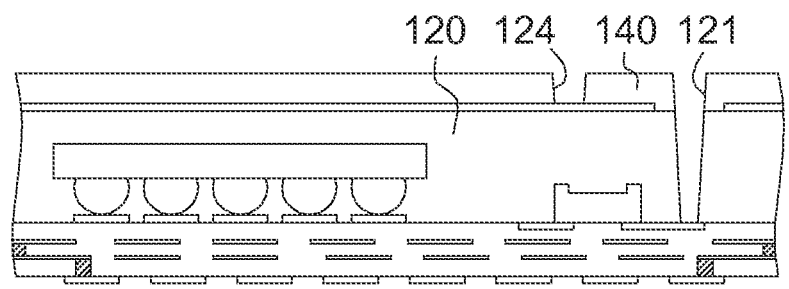

Referring to FIG. 29C, a feeding through hole 121 penetrating the dielectric structure 140 and the package body 120 and an antenna grounding through hole 124 are formed.

Figure 29D:
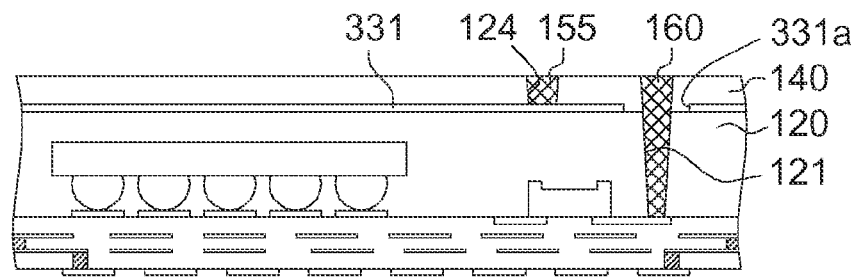

Referring to FIG. 29D, a feeding element 160 is formed by filling the feeding through hole 121 with conductive material and an antenna grounding element 155 is formed by filling respectively the antenna grounding through hole 124 with conductive material, wherein the feeding element 160 passes through the dielectric structure 140, the opening 331a and the package body 120, and the antenna grounding element 155 contacts the first conformal shielding film 331.

Figure 29E:
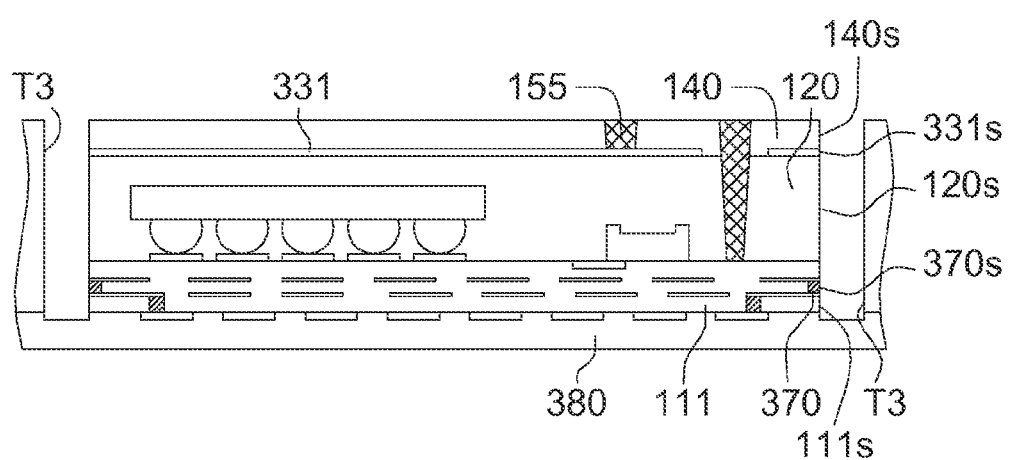

Referring to FIG. 29E, a first singulation path T3 passing through the package body 120, the dielectric structure 140, the first conformal shielding film 331 and the first substrate 111 is formed. Wherein, the lateral surface 120s of the package body 120, the lateral surface 111s of the first substrate 111, the lateral surface 140s of the dielectric structure 140, the lateral surface 331s of the first conformal shielding film 331 and the lateral surface 370s of the grounding segment 370 are substantially aligned with one another. In addition, the first substrate 111 can be adhered onto the carrier 380 before the first singulation path T3 is formed. The first singulation path T3 may pass through a part of the carrier 380 to completely cut off the package body 120, the dielectric structure 140, the first conformal shielding film 331 and the first substrate 111.

Figure 29F:
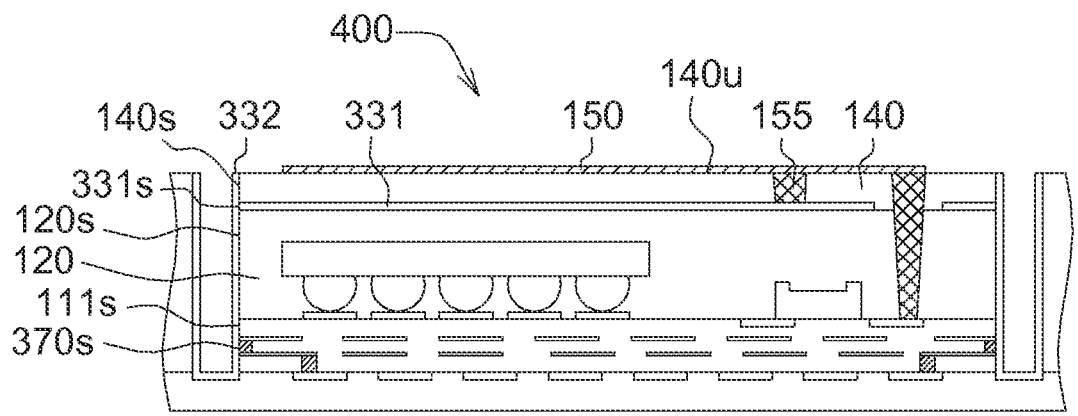

Referring to FIG. 29F, an antenna element 150 is formed on the upper surface 140u of the dielectric structure 140. A grounding element 332 covering the lateral surface 120s of the package body 120, the lateral surface 111s of the first substrate 111, the lateral surface 140s of the dielectric structure 140, the lateral surface 331s of the first conformal shielding film 331 and the lateral surface 370s of the grounding segment 370 is formed. After the carrier 380 is removed and the electrical contact 114 is disposed adjacent to the lower surface 111b of first substrate 111, the semiconductor package 300 as illustrated in FIG. 15 is formed.

Referring to FIGS. 30A~30F, manufacturing processes according to the semiconductor package of FIG. 17 are illustrated.

Figure 30A:
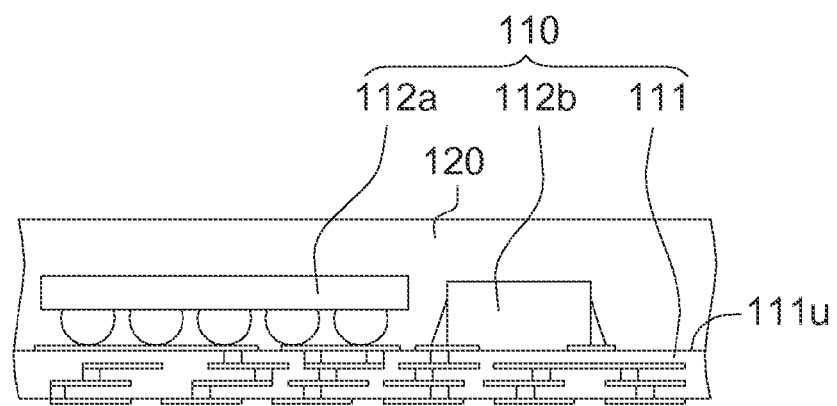
FIGS. 30A-30F illustrate manufacturing processes according to the semiconductor package of FIG. 17.

Referring to FIG. 30A, a semiconductor device 112a and a passive component 112b are disposed adjacent to the upper surface 111u of the first substrate 111 by such as surface mount technology (SMT). Then, a package body 120 is formed to cover the upper surface 111u of the first substrate 111, the semiconductor device 112a and the passive component 112b.

Figure 30B:
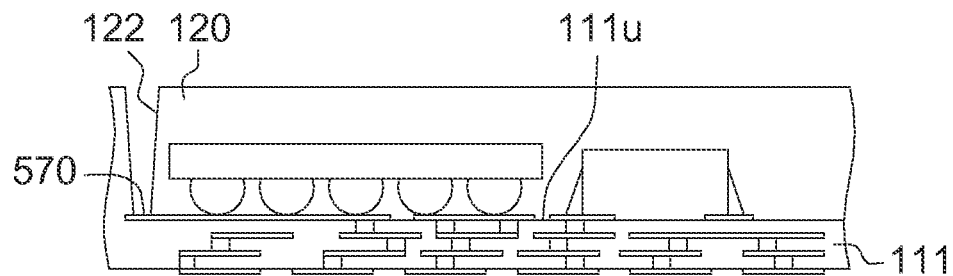

Referring to FIG. 30B, a grounding through hole 122 penetrating the package body 120 is formed. The grounding through hole 122 exposes the grounding segment 570. In an embodiment, the formation process of the grounding through hole 122 can be integrated with the formation process of the protection structure 120.

Figure 30C:
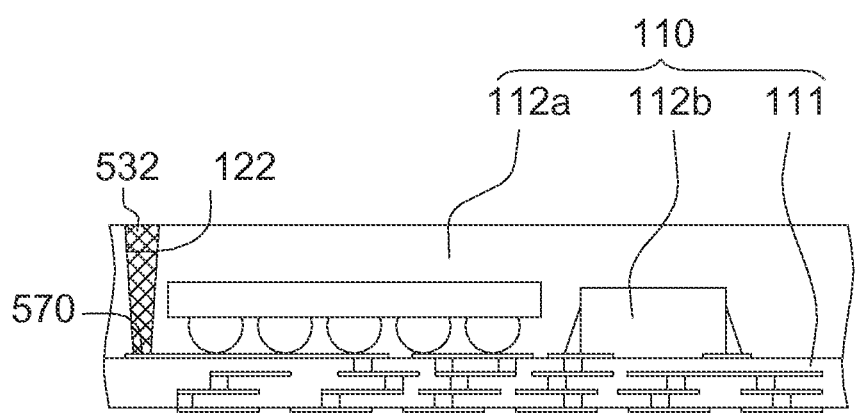

Referring to FIG. 30C, a grounding element 532 is formed by filling the grounding through hole 122 with conductive material, wherein the grounding element 532 is electrically connected to the grounding segment 570 on the first substrate 111.

Figure 30D:
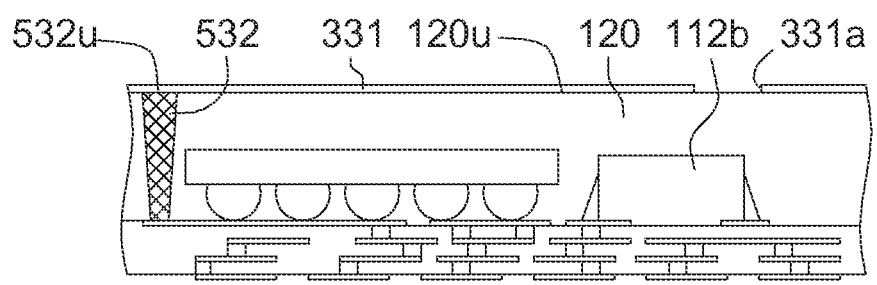

Referring to FIG. 30D, a first conformal shielding film 331 covering the upper surface 120u of the package body 120 is formed. The first conformal shielding film 331 has an opening 331a from which a part of the package body 120 is exposed, wherein the position of opening 331a corresponds to the semiconductor device 112a or the passive component 112b. In the present embodiment of the invention, the position of opening 331a corresponds to the passive component 112b. In FIG. 30D, the first conformal shielding film 331 directly contacts the upper surface 532u of the grounding element 532. However, in other embodiment, the grounding element 532 may be formed after the first conformal shielding film 331 is disposed on the upper surface 120u of package body, so that a part of the upper surface 532u of the grounding element 532 can be exposed from the first conformal shielding film 331.

Figure 30E:
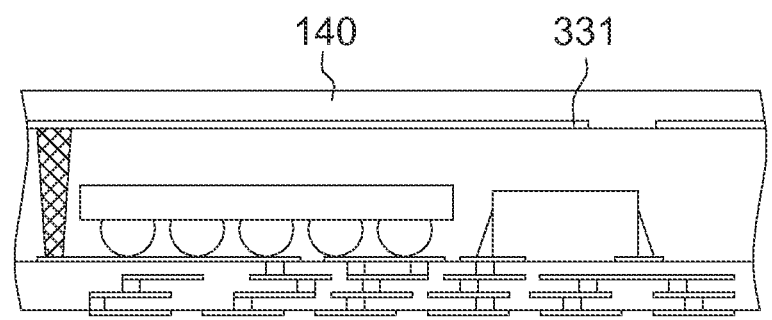

Referring to FIG. 30E, a dielectric structure 140 covering the first conformal shielding film 331 is formed.

Figure 30F:
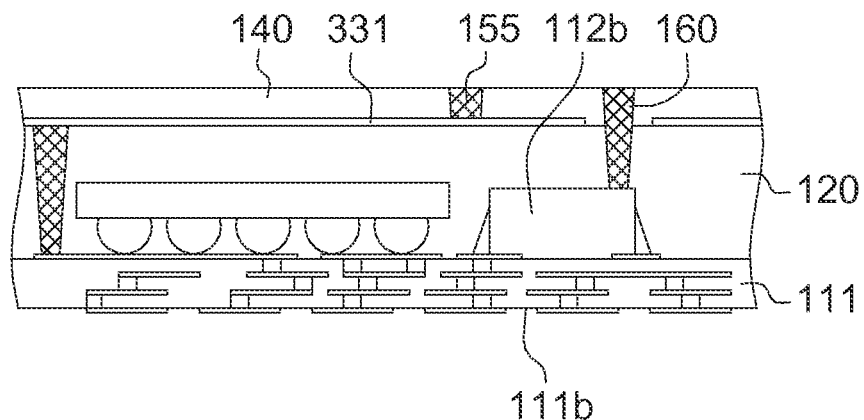

Referring to FIG. 30F, a feeding element 160 is formed by creating an opening passing through the package body 120 as well as the dielectric structure 140 and filling the opening with conductive material. In the present embodiment, the feeding element 160 is electrically connected to the passive component 112b. In addition, an antenna grounding element 155 is formed by creating an opening passing through the dielectric structure 140 and filling the opening with conductive material. Then, the antenna element 150 as illustrated in FIG. 17 is formed on the dielectric structure 140 and directly contacts the feeding element 160. An electrical contact 114 as illustrated in FIG. 17 is disposed adjacent to the lower surface 111b of the first substrate 111. Then, a singulation path (not illustrated) is formed, wherein the singulation path passes through the dielectric structure 140, the package body 120, the first conformal shielding film 331 and the first substrate 111, to form a semiconductor package 500 as illustrated in FIG. 17. In an embodiment, the electrical contact 114 can be formed after the formation of the singulation path.

Referring to FIGS. 31A-31G, manufacturing processes according to the semiconductor package of FIG. 18 are illustrated.

Figure 31A:
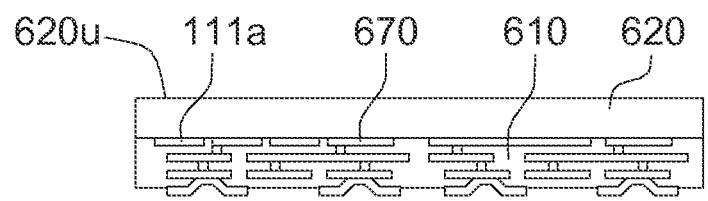
FIGS. 31A-31G illustrate manufacturing processes according to the semiconductor package of FIG. 18.

Referring to FIG. 31A, a semiconductor die including an integrated circuit 610 having an active surface and a silicon substrate 620 having an inactive surface are provided. The integrated circuit 610 may include one or more transistors, diodes, inductors, capacitors, resistors and other circuit elements, and a grounding segment 670 and a feeding point 111a is formed within the integrated circuit 610. In addition, a plurality of contact pads and a redistribution layer (not illustrated) may be disposed to be electrically connected to the integrated circuit 610. To reduce the thickness of the semiconductor die, a part of the silicon substrate 620 may be removed by grinding.

Figure 31B:
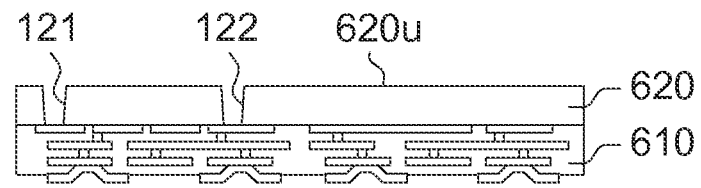

Referring to FIG. 31B, a feeding through hole 121 and a grounding through hole 122 (which may be a through silicon via) are formed in the silicon substrate 620, wherein the feeding through hole 121 and the grounding through hole 122 extend from a upper surface 620u of the silicon substrate 620 to a front surface (the surface with integrated circuit 610 formed thereon). For example, the feeding through hole 121 and the grounding through hole 122 may be formed by performing deep reactive-ion etching (RIE) on the silicon substrate 620. The feeding through hole 121 and the grounding through hole 122 are formed using a via-last approach, that is, the feeding through hole 121 and the grounding through hole 122 are formed after the formation of the integrated circuit 610.

Figure 31C:
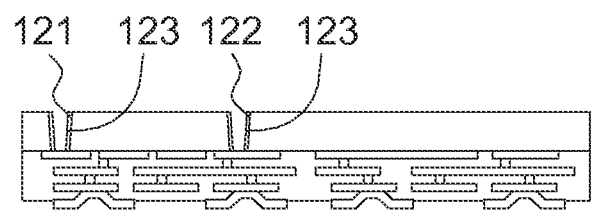
Figure 31D:
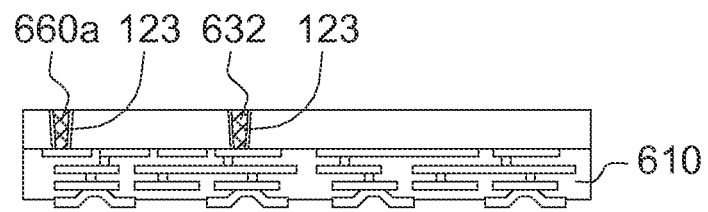

Referring to FIG. 31C, a seed layer 123 is formed on the wall of the feeding through hole 121 and the grounding through hole 122. The usable materials of the seed layer include copper or copper alloys. In an embodiment, the seed layer is formed using sputtering. In other embodiments, chemical vapor deposition (CVD) or electro plating may be used. Additionally, an annular insulation layer (not shown) may be formed in the feeding through hole 121 prior to the application of the seed layer 123. Referring to FIG. 31D, a grounding element 632 and a first feeding sub-element 660a are formed by filling respectively the grounding through hole 122 and feeding through hole 121 with conductive material such as Cu, Al, Sn, Ni, Au, or Ag. The grounding element 632 is electrically connected to the grounding segment 670 of the integrated circuit 610, and the first feeding sub-element 660a is electrically connected to the feeding point 111a of the integrated circuit 610. In addition, the grounding element 632 and the first feeding sub-element 660a can be concurrently formed in the same manufacturing process.

Figure 31E:
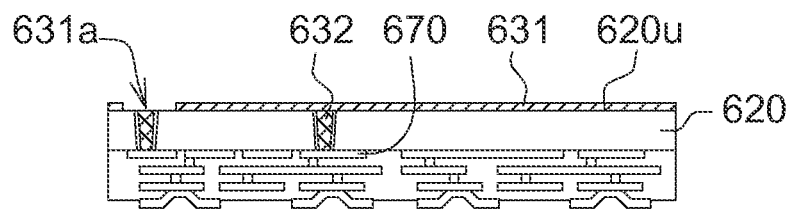

Referring to FIG. 31E, a first conformal shield 631 covering the upper surface 620u of the silicon substrate 620 is formed. After the first conformal shield 631 and the grounding element 632, shown in FIG. 31E as a via, are formed, the grounding element 632 providing a ground path that electrically connects the integrated circuit 610 and the first conformal shield 631. In addition, the first conformal shield 631 has an opening 631a from which the first feeding sub-element 660a is exposed, i.e. the feeding element 660 and the feeding sub-element 660a are electrically isolated from the first conformal shield 631.

Figure 31F:
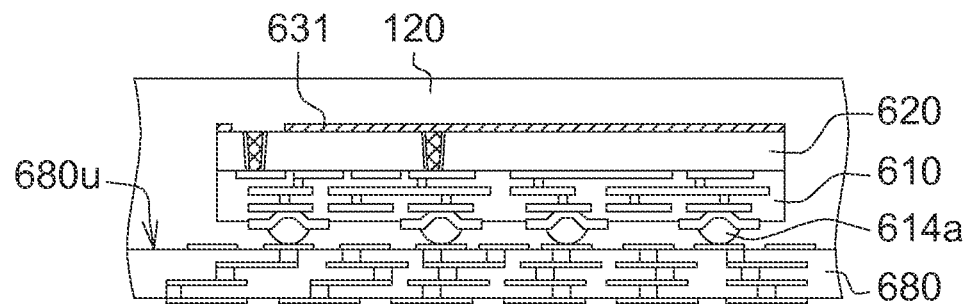

Referring to FIG. 31F, an electrical contact 614a is formed on the contact pad of the integrated circuit 610. Then, the semiconductor die is disposed adjacent to the upper surface 680u of the second substrate 680, wherein the integrated circuit 610 electrically connects the second substrate 680 through the electrical contact 614a. Then, a package body 120 encapsulating the first conformal shield 631, the upper surface 680u of the second substrate 680 and the semiconductor die is formed.

Figure 31G:
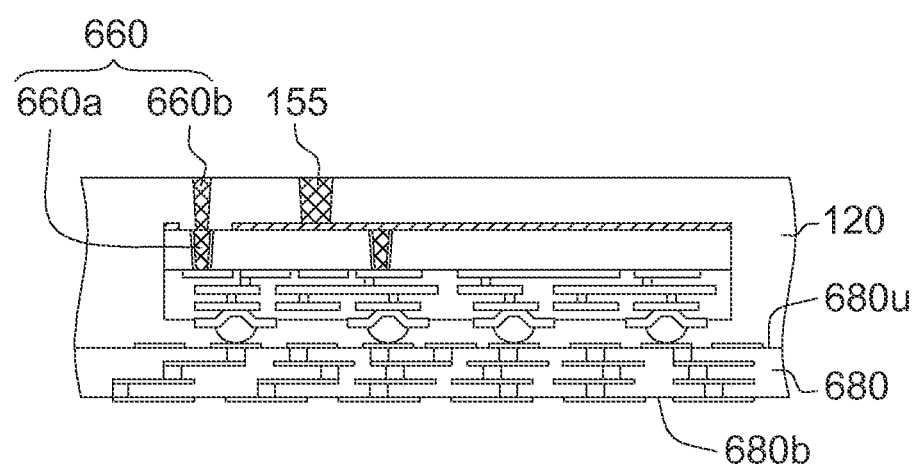

Referring to FIG. 31G, a second feeding sub-element 660b is formed, wherein the first feeding sub-element 660a and the second feeding sub-element 660b are combined to form a feeding element 660. In addition, the formation method of the second feeding sub-element 660b is similar to that of the second feeding sub-element 260b of FIG. 3, and the similarities are not repeated here. Moreover, an antenna grounding element 155 is formed by creating an opening passing through a package body 120 and filling the opening with conductive material. Then, the antenna element 150 as illustrated in FIG. 18 is formed on the package body 120, and a singulation path (not illustrated) passing through the package body 120 and the second substrate 680 is formed to produce a semiconductor package 600 as illustrated in FIG. 18. In an embodiment, an electrical contact 114 illustrated in FIG. 15 may be formed adjacent to the lower surface 680b of the second substrate 680 after or before the formation of the singulation path.

Referring to FIG. 31G, the first feeding sub-element 660a and the second feeding sub-element 660b are combined to form a feeding element 660. However, as illustrated in FIG. 20, the feeding element 660 may penetrate the package body 120 to be electrically connected to the antenna element 150 and the feeding point disposed on the second substrate 680.

Referring to FIGS. 32A-32E, manufacturing processes according to the semiconductor package of FIG. 18 are illustrated, wherein via-first approach is introduced.

Figure 32A:
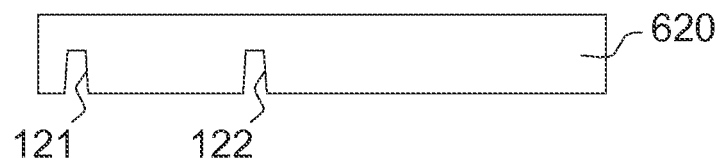
FIGS. 32A-32G illustrate manufacturing processes according to the semiconductor package of FIG. 18.

Referring to FIG. 32A, a silicon substrate 620 is provided and one feeding through hole 121 and grounding through hole 122 are formed in the silicon substrate 620. The feeding through hole 121 and the grounding through hole 122 may be formed by performing deep reactive-ion etching (RIE) or laser ablation on the silicon substrate 620.

Figure 32B:
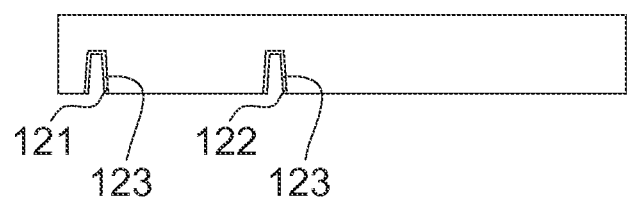

Referring to FIG. 32B, a thin seed layer 123 is formed on the wall of the feeding through hole 121 and the grounding through hole 122. The usable materials of the seed layer include copper or copper alloys. In an embodiment, the seed layer is formed using sputtering. In other embodiments, physical vapor deposition (PVD) or electro plating may be used.

Figure 32C:
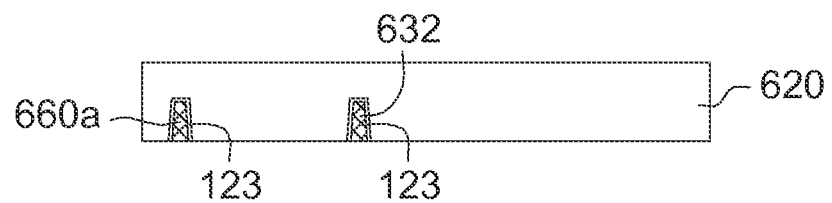

Referring to FIG. 32C, a grounding element 632 and a first feeding sub-element 660a are formed by filling the feeding through hole 121 and the grounding through hole 122 with conductive material such as Cu, Al, Sn, Ni, Au, or Ag.

Figure 32D:
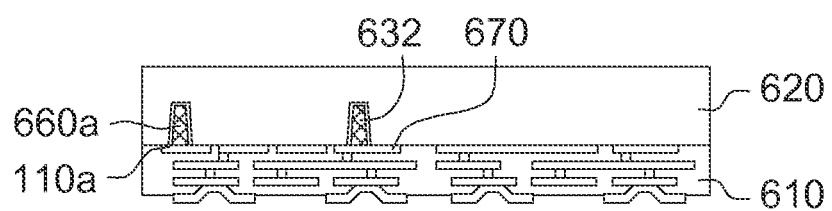

Referring to FIG. 32D, an integrated circuit 610 is formed to connect the silicon substrate. The integrated circuit 610 may include one or more transistors, diodes, inductors, capacitors, resistors and other circuit elements. A grounding segment 670 and a feeding point 111a are formed within the integrated circuit 610. In the present embodiment, the feeding through hole 121 and grounding through hole 122 are formed using a via-first approach, that is, the feeding through hole 121 and grounding through hole 122 are formed before the formation of the integrated circuit 610. The grounding element 632 is electrically connected to the grounding segment 670, and the first feeding sub-element 660a is electrically connected to the feeding point 111a. In addition, a plurality of contact pads and a redistribution layer (not illustrated) may be disposed to electrically connect the integrated circuit 610.

Figure 32E:
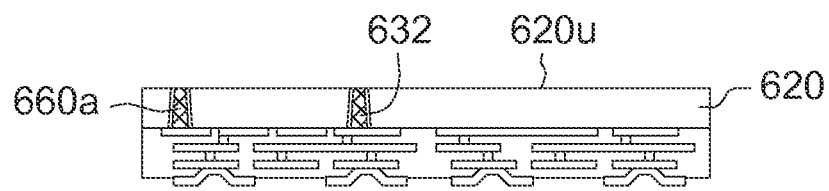

Referring to FIG. 32E, a part of the silicon substrate 620 is removed by grinding. The grounding element 632 and the first feeding sub-element 660a are exposed from the upper surface 620u of the silicon substrate 620.

Figure 32F:
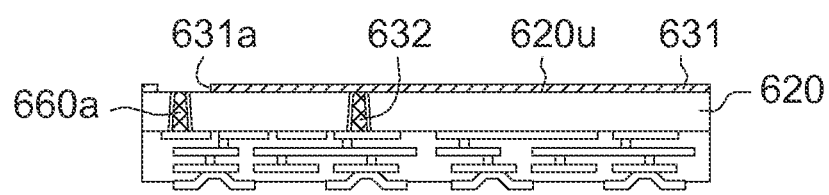

Referring to FIG. 32F, a first conformal shield 631 covering the upper surface 620u of the silicon substrate 620 is formed. After the first conformal shield 631 and the grounding element 632 are formed, the grounding element 632 electrically connects the integrated circuit 610 and the first conformal shield 631. In addition, the first conformal shield 631 has an opening 631a from which the first feeding sub-element 660a is exposed.

Figure 32G:
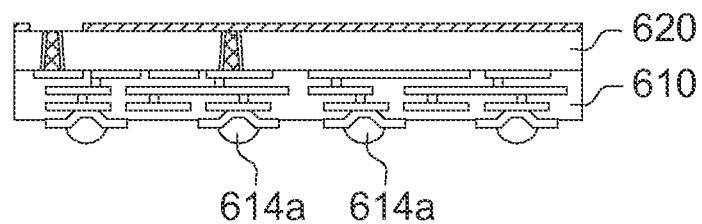

Referring to FIG. 32G, an electrical contact 614a is formed on the contact pad of the integrated circuit 610. Then, as illustrated in FIG. 18, the semiconductor die is disposed adjacent to the upper surface 680u of the second substrate 680, wherein the integrated circuit 610 electrically connects the second substrate 680 through the electrical contact 614a. Then, a dielectric structure 140 encapsulating the first conformal shield 631, the upper surface 680u of the second substrate 680 and the semiconductor die is formed. The following processes are similar to those of semiconductor 600, and the similarities are not repeated here.

Figure 33A:
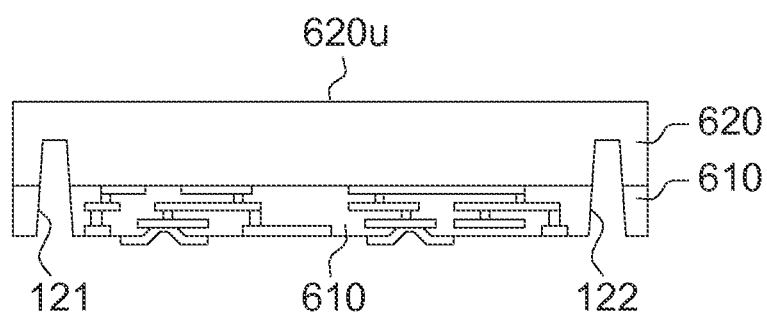
FIGS. 33A-33F illustrate manufacturing processes according to the semiconductor package of FIG. 19.

Referring to FIGS. 33A-33E, manufacturing processes according to the semiconductor package of FIG. 19 are illustrated Referring to FIG. 33A, a feeding through hole 121 and a grounding through hole 122 are formed in a silicon substrate 620 and an integrated circuit 610. That is, the feeding through hole 121 and the grounding through hole 122 extend from the surface of the integrated circuit 610 (the surface with the contact pad formed thereon) to the silicon substrate 610, but back ends of the feeding through hole 121 and the grounding through hole 122 are not exposed from the upper surface 620u of the silicon substrate 620. In the present embodiment, the feeding through hole 121 and the grounding through hole 122 may be formed by performing deep reactive-ion etching (RIE) on the integrated circuit 610. In another embodiment, the grounding through hole 122 may be formed by performing laser ablation on the silicon substrate 620.

Figure 33B:
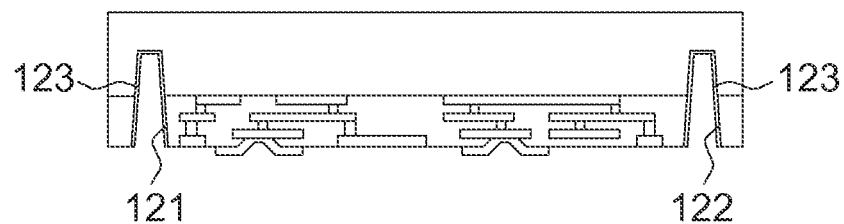

Referring to FIG. 33B, a thin seed layer 123 is formed on the wall of the feeding through hole 121 and grounding through hole 122. The usable materials of the seed layer include copper or copper alloys. In an embodiment, the seed layer is formed using sputtering. In other embodiments, physical vapor deposition (PVD) or electro plating may be used.

Figure 33C:
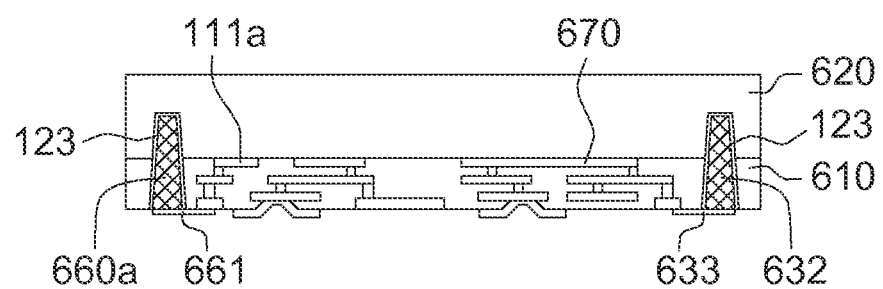

Referring to FIG. 33C, a grounding element 632 and a first feeding sub-element 660a are formed by filling respectively the grounding through hole 122 and the feeding through hole 121 with conductive material such as Cu, Al, Sn, Ni, Au, or Ag. The grounding element 632 is electrically connected to the grounding segment 670 of the integrated circuit 610 through a first metal layer 633, and the first feeding sub-element 660a is electrically connected to the feeding point 111a of the integrated circuit 610 through a second metal layer 661. In addition, the grounding element 632 and the first feeding sub-element 660a can be concurrently formed in the same manufacturing process.

Figure 33D:
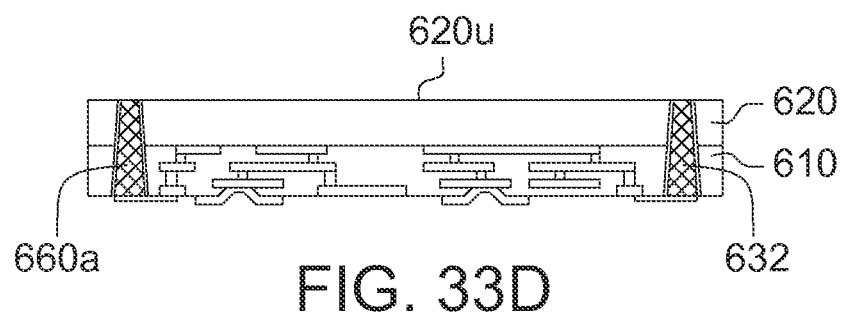

Referring to FIG. 33D, a part of the silicon substrate 620 is removed by grinding, and back ends of the grounding element 632 and the first feeding sub-element 660a are therefore exposed from the upper surface 620u of the silicon substrate 620.

Figure 33E:
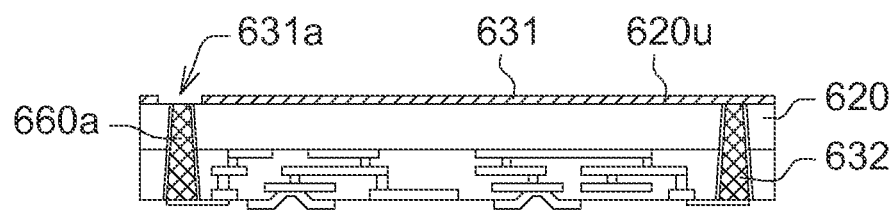

Referring to FIG. 33E, a first conformal shield 631 covering the upper surface 620u of the silicon substrate 620 is formed. After the first conformal shield 631 and the grounding element 632 are formed, the grounding element 632 electrically connects the integrated circuit 610 and the first conformal shield 631. In addition, the first conformal shield 631 has an opening 631a from which the first feeding sub-element 660a is exposed.

Figure 33F:
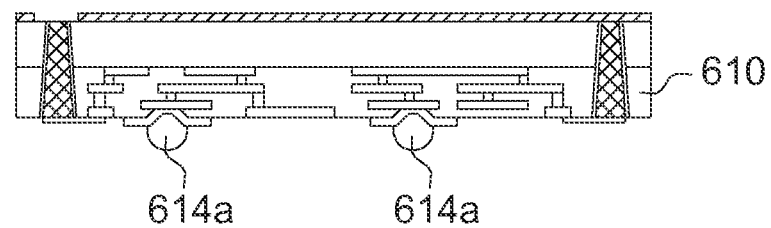

Referring to FIG. 33F, an electrical contact 614a is formed on the contact pad of the integrated circuit 610. Then, as illustrated in FIG. 19, the semiconductor die is disposed adjacent to the upper surface 680u of the second substrate 680, wherein the integrated circuit 610 electrically connects the second substrate 680 through the electrical contact 614a. Then, a dielectric structure 140 encapsulating the first conformal shield 631, the upper surface 680u of the second substrate 680 and the semiconductor die is formed. Then, a second feeding sub-element 660b is formed, wherein the first feeding sub-element 660a and the second feeding sub-element 660b are combined to form a feeding element 660. Then, the antenna element 150, as illustrated in FIG. 19, is formed on the dielectric structure 140, and a singulation path (not illustrated) passing through the dielectric structure 140 and the second substrate 680 is formed to produce the semiconductor package 700 as illustrated in FIG. 19.

Referring to FIGS. 34A-34E, manufacturing processes according to the semiconductor package of FIG. 21 are illustrated.

Figure 34A:
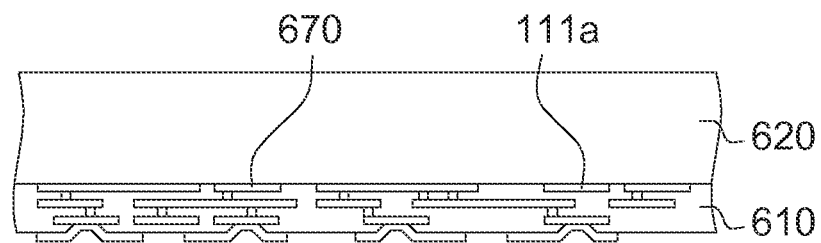
FIGS. 34A-34E illustrate manufacturing processes according to the semiconductor package of FIG. 21.

Referring to FIG. 34A, a semiconductor die including an integrated circuit 610 and a silicon substrate 620 is provided. The integrated circuit 610 may include one or more transistors, diodes, inductors, capacitors, resistors and other circuit elements. A grounding segment 670 and a feeding point 111a are formed within the integrated circuit 610. In addition, a plurality of contact pads and a redistribution layer (not illustrated) are disposed on the integrated circuit 610.

Figure 34B:
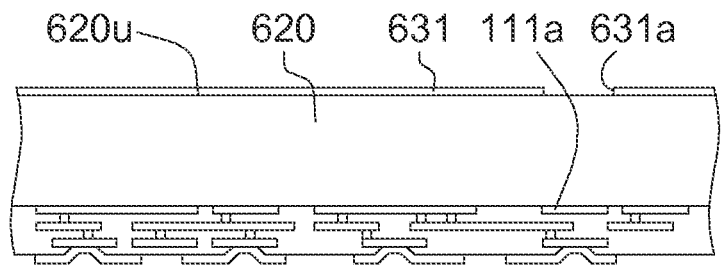

Referring to FIG. 34B, a first conformal shield 631 covering the upper surface 620u of the silicon substrate 620 is formed. The first conformal shield 631 has an opening 631a from which a part of the silicon substrate 620 is exposed, wherein the position of the opening 631a corresponds to the feeding point 111a.

Figure 34C:
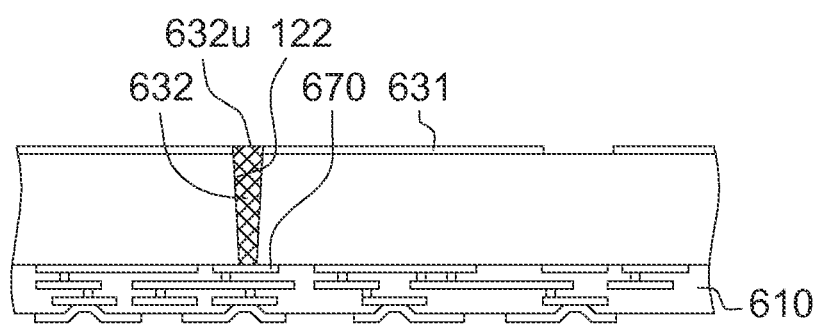

Referring to FIG. 34C, a grounding element 632 is formed by forming one grounding through hole 122 in the silicon substrate 620 of semiconductor die and filling the grounding through hole 122 with conductive material. The first conformal shield 631 covers a lateral surface of the grounding element 632, and the upper surface 632u of the grounding element 632 is exposed from the first conformal shield 631. The grounding element 632 is electrically connected to the integrated circuit 610 and the first conformal shield 631.

Figure 34D:
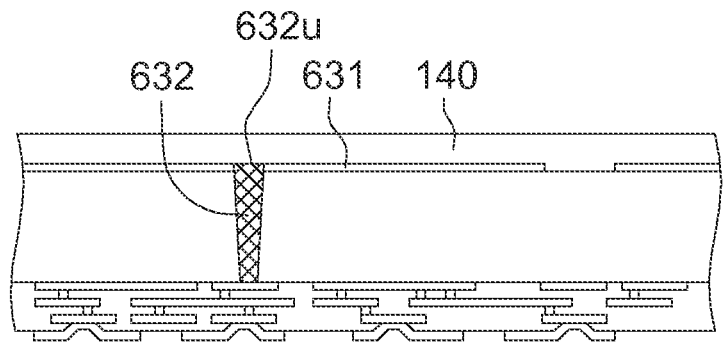

Referring to FIG. 34D, a dielectric structure 140 covering the first conformal shield 631 and the upper surface 632u of the grounding element 632 is formed.

Figure 34E:
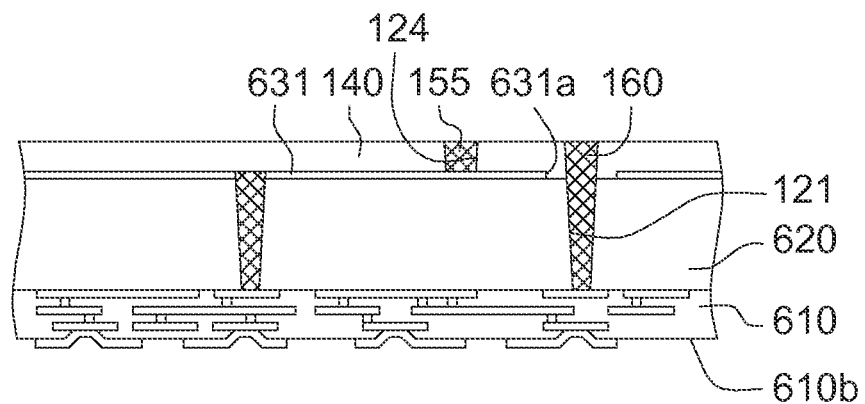

Referring to FIG. 34E, the feeding element 160 is formed by forming a feeding through hole 121 passing through the dielectric structure 140, the opening 631a and the silicon substrate 620, and then filling the feeding through hole 121 with conductive material, wherein the feeding element 160 is electrically connected to the integrated circuit 610. In addition, an antenna grounding element 155 is formed by forming an antenna grounding through hole 124 passing through the dielectric structure 140, and then filling the antenna grounding through hole 124 with conductive material, wherein the antenna grounding element 155 is electrically connected to the first conformal shield 631. Then, the antenna element 150, illustrated in FIG. 21, is formed on the dielectric structure 140, wherein the antenna element 150 directly contacts the feeding element 160. Then, an electrical contact 140, as illustrated in FIG. 21, is formed adjacent to the lower surface 610b of the circuit structure 610. A singulation path (not illustrated) passing through the dielectric structure 140, the first conformal shield 631, the silicon substrate 620 and the integrated circuit 610 is then formed to produce the semiconductor package 900 as illustrated in FIG. 21. In an embodiment, the electrical contact 140 can be formed before or after the formation of the singulation path.

Referring to FIGS. 35A-35D, manufacturing processes according to the semiconductor package of FIG. 22 are illustrated.

Figure 35A:
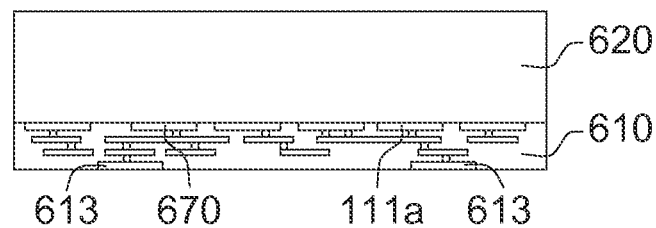
FIGS. 35A-35D illustrate manufacturing processes according to the semiconductor package of FIG. 22.

Referring to FIG. 35A, a semiconductor die including the integrated circuit 610 and the silicon substrate 620 is provided. The integrated circuit 610 may include one or more transistors, diodes, inductors, capacitors, resistors, and a grounding segment 670. The feeding point 111a is formed within the integrated circuit 610.

Figure 35B:
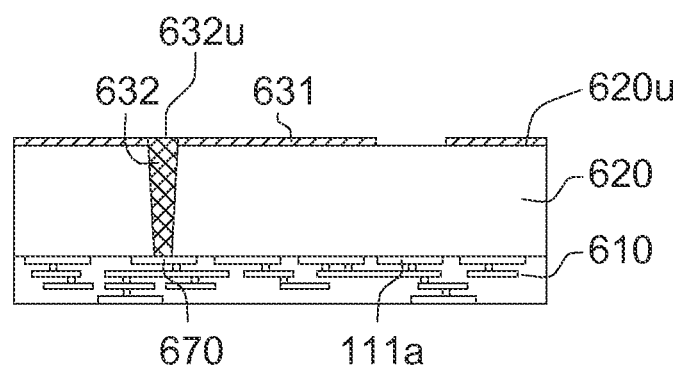

Referring to FIG. 35B, the grounding element 632 is produced by forming an opening in the silicon substrate 620 and filling the opening with conductive material. Then, the first conformal shield 631 covering the upper surface 620u of the silicon substrate 620 is formed, wherein the first conformal shield 631 covers a lateral surface of the grounding element 632 and the upper surface 632u of the grounding element 632 is exposed from the first conformal shield 631. The grounding element 632 is electrically connected to the grounding segment 670 of the integrated circuit 610.

Figure 35C:
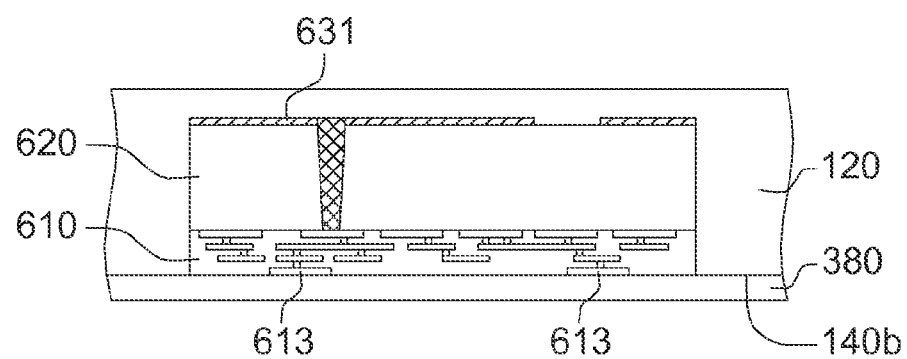

Referring to FIG. 35C, the package body 120 covering the integrated circuit structure 610 and the silicon substrate 620 is formed. The integrated circuit structure 610 and the silicon substrate 620 can be adhered onto the carrier 380 via the pad 613 before the package body 120 is formed. After the package body 120 is formed, the carrier 380 can be removed to expose the pad 613 and the lower surface 140b of the package body 120.

Figure 35D:
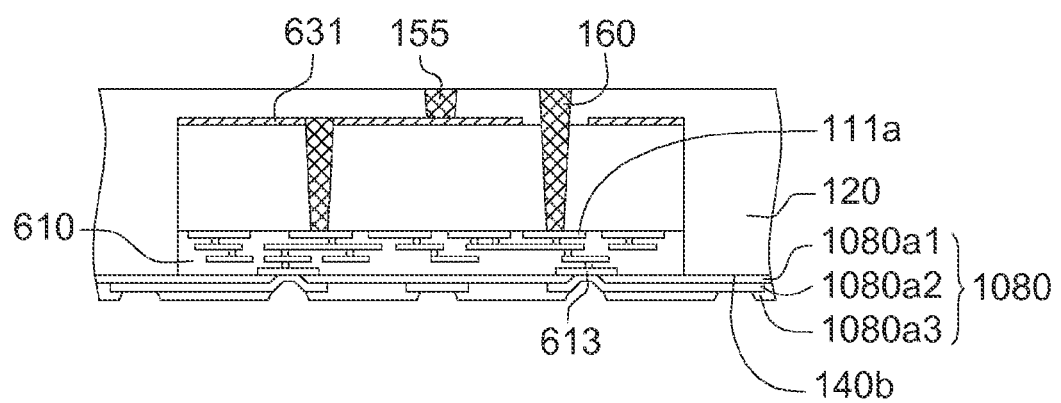

Referring to FIG. 35D, the redistribution layer 1080 is formed on the integrated circuit 610 and the lower surface 140b of the package body 120. The redistribution layer 1080 includes a first dielectric layer 1080a1, a patterned conductive layer 1080a2 and a second dielectric layer 1080a3. The first dielectric layer 1080a1 covers the lower surface 140b of the package body 120 and exposes the pad 613. The patterned conductive layer 1080a2 covers the first dielectric layer 1080a1 and is electrically connected to the pad 613. The second dielectric layer 1080a3 covers the patterned conductive layer 1080a2 and exposes a part of the patterned conductive layer 1080a2.

Referring to FIG. 35D, the first dielectric layer 1080a1 can be formed by patterning a dielectric material, which is formed by the coating technology such as printing, spinning or spraying. The formation of the second dielectric layer 1080a3 is similar to that of the first dielectric layer 1080a1. The patterned conductive layer 1080a2 can be formed by patterning a conductive material, which is formed by the material formation technology.

Referring to FIG. 35D, the feeding element 160 is produced by forming an opening in the silicon substrate 620 as well as the package body 120 and then filling the opening with conductive material, wherein the feeding element 160 is electrically connected to the feeding point 611a of the integrated circuit 610. In addition, an antenna grounding element 155 is formed by forming an opening in the package body 120, and then filling the opening with conductive material, wherein the antenna grounding element 155 is electrically connected to the first conformal shield 631. Then, the electrical contact 114 as illustrated in FIG. 22 can be formed on an exposed patterned conductive layer 1080a2, so that the electrical contact 114 is electrically connected to the pad 113. Then, a singulation path (not illustrated) passing through the package body 120 and the redistribution layer 1080 is formed to produce the semiconductor package 1000 of FIG. 22. In an embodiment, the electrical contact 114 can be formed after the singulation path is formed.

Referring to FIGS. 36A-36E, manufacturing processes according to the semiconductor package of FIG. 23 are illustrated.

Figure 36A:
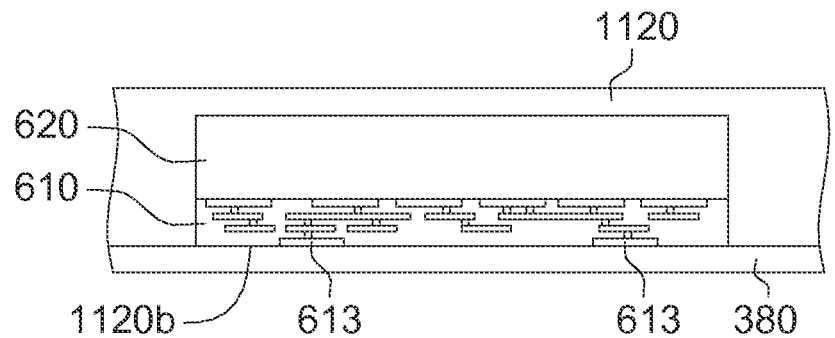
FIGS. 36A-36E illustrate manufacturing processes according to the semiconductor package of FIG. 23.

Referring to FIG. 36A, the semiconductor die including an integrated circuit structure 610 and the silicon substrate 620 is provided. After the integrated circuit 610 and the silicon substrate 620 are adhered onto the carrier 380, the package body 1120 encapsulating the semiconductor die is formed. The carrier 380 is removed to expose the pad 613 of the integrated circuit 610 and the lower surface 1120b of the package body 1120 after the package body 1120 is formed.

Figure 36B:
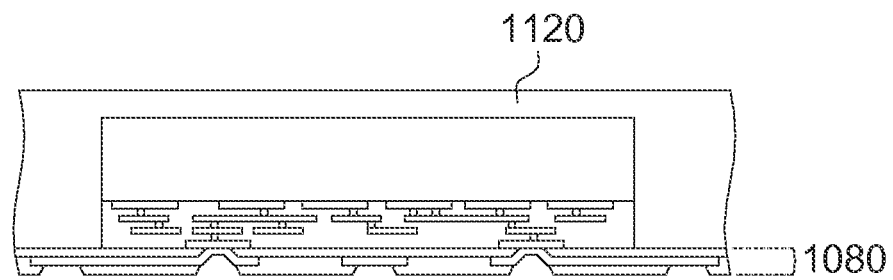

Referring to FIG. 36B, the redistribution layer 1080 is formed on the integrated circuit 610 and the lower surface 1120b of the package body 1120.

Figure 36C:
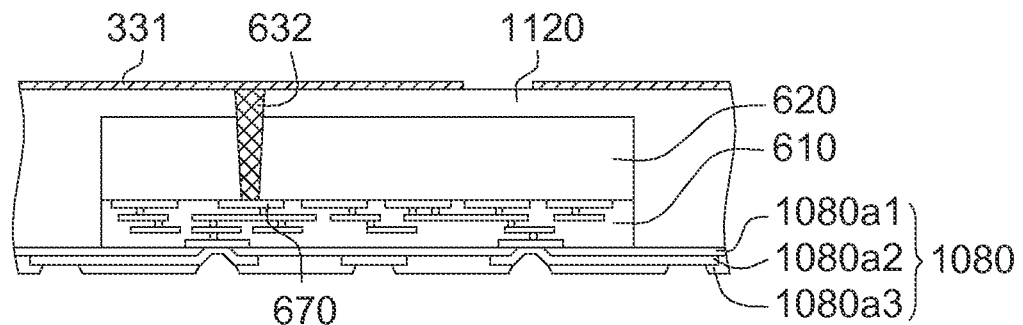

Referring to FIG. 36C, the grounding element 632 is produced by forming an opening passing through the silicon substrate 620 as well as the package body 1120 and filling the opening with conductive material, wherein the grounding element 632 is electrically connected to the grounding segment 670 of the integrated circuit 610. Then, the first conformal shielding film 331 is formed adjacent to the upper surface of the silicon substrate 620. As illustrated in FIG. 33C, the first conformal shielding film 331 is formed on the package body 1120, which is disposed adjacent to the upper surface 620u of the protection structure 620.

Figure 36D:
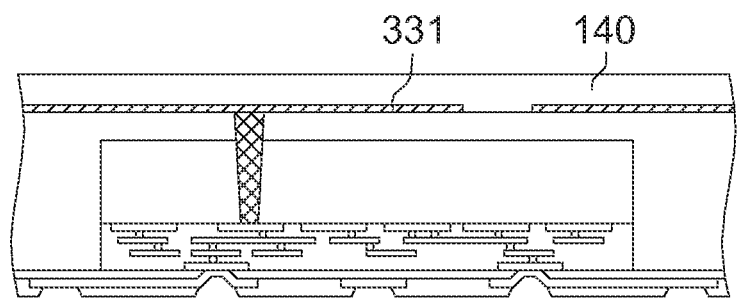

Referring to FIG. 36D, a dielectric structure 140 covering the first conformal shielding film 331 is formed.

Figure 36E:
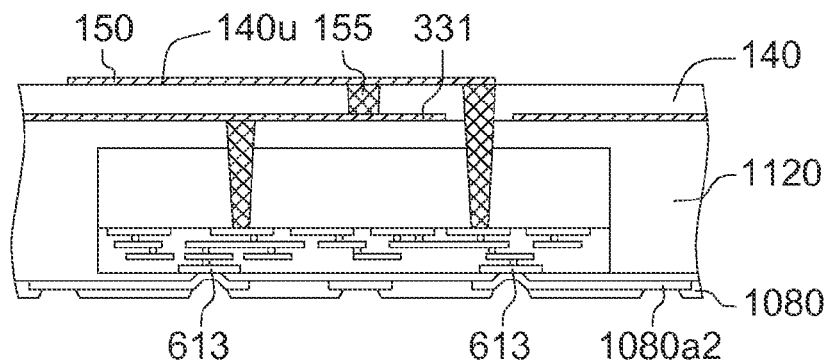

Referring to FIG. 36E, the feeding element 160 is produced by forming a through-hole passing through the package body 1120 and the dielectric structure 140 and filling the through-hole with conductive material. In addition, an antenna grounding element 155 is produced by forming a through-hole passing through the package body 1120 and filling the through-hole with conductive material. Then, an antenna element 150 is formed on the upper surface 140*u* of the dielectric structure 140 which directly contacts the feeding element 160. Then, an electrical contact 614, as illustrated in FIG. 23, can be formed on an exposed patterned conductive layer 1080*a*2, so that the electrical contact 614 is electrically connected to the pad 613. Then, a singulation path passing through the dielectric structure 140, the first conformal shielding film 331, the package body 1120 and the redistribution layer 1080 is formed. At this point, the formation of the semiconductor package 1100 of FIG. 23 is completed. In an embodiment, the electrical contact 614 can also be formed after the singulation path is formed.

Referring to FIGS. 37A-37K, processes for manufacturing the semiconductor package 1200 of FIG. 24 are illustrated.

Figure 37A:
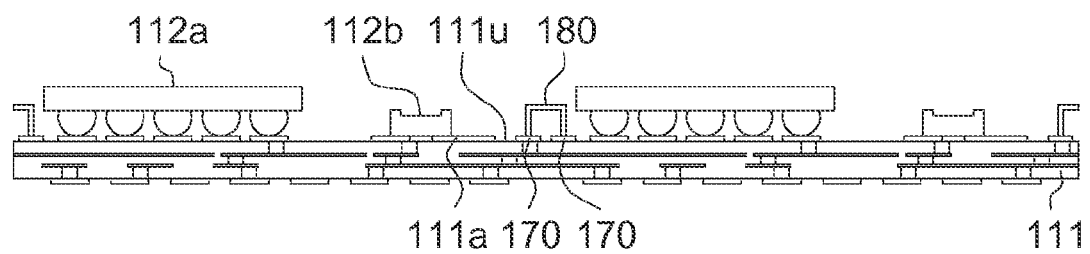
FIGS. 37A-37K illustrate manufacturing processes according to the semiconductor package of FIG. 24.

Referring to FIG. 37A, a semiconductor device 112*a* and a passive component 112*b* are disposed adjacent to an upper surface 111*u* of the first substrate 111 using, for example, surface mount technology (SMT). The first substrate 111 includes the grounding segment 170 and the feeding point 111*a*. As illustrated in FIG. 37A, a grounding frame 180 is disposed adjacent to the upper surface 111*u* of the first substrate 111 using, for example, surface mount technology. The grounding frame 180 is connected to the grounding segment 170.

Figure 37B:
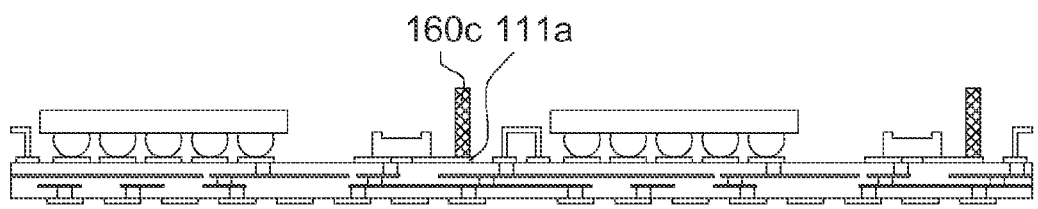

Referring to FIG. 37B, a first feeding sub-element 160*c* is formed in the feeding point 111*a* by, for example, wire-bond technique. The first feeding sub-element 160*c* can be a bond wire material, for example.

Figure 37C:
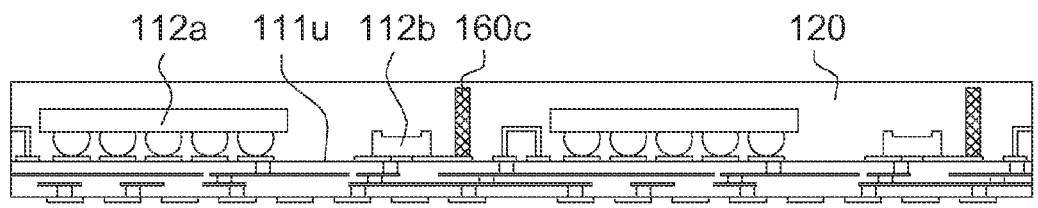

Referring to FIG. 37C, a package body 120 encapsulating the semiconductor element and the first feeding sub-element 160*c* is formed on the upper surface 111*u* of the first substrate 111.

Figure 37D:
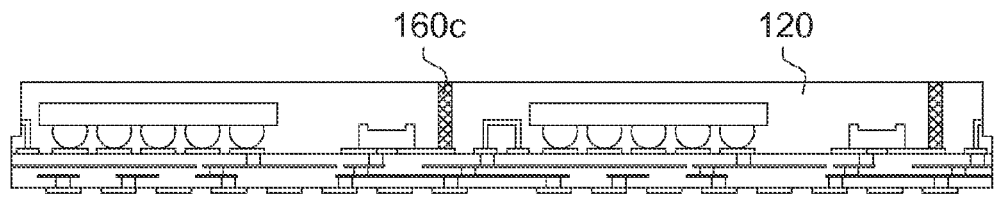

Referring to FIG. 37D, a part of the package body 120 may be removed by grinding to expose the first feeding sub-element 160*c*.

Figure 37E:
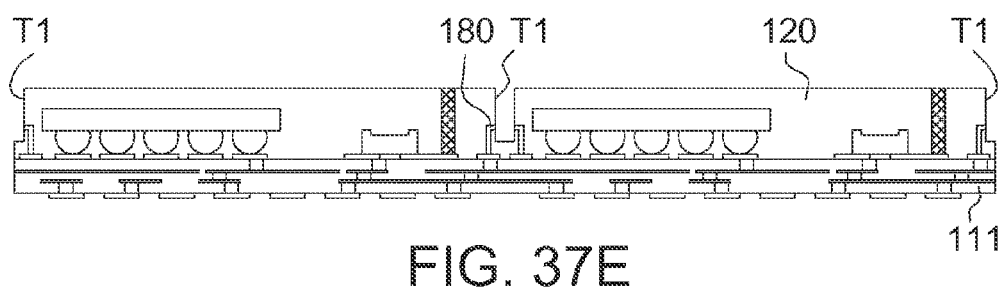

Referring to FIG. 37E, a first singulation path T1 is formed, wherein the first singulation path T1 passes through the package body 120 and the grounding frame 180 to cut off the grounding frame 180. In the present embodiment, the first singulation path T1 passes through a part of the package body 120. In another embodiment, the first singulation path T1 can pass through the entire package body 120 and a part of the first substrate 111.

Figure 37F:
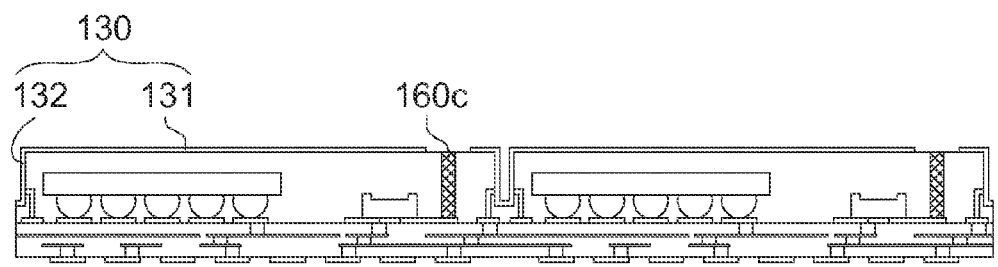

Referring to FIG. 37F, an electromagnetic interference shielding element 130 covering a lateral surface of the package body 120 and the grounding frame 180 exposed form the lateral surface of the package body 120 is formed. The electromagnetic interference shielding element 130 includes a first conformal shielding film 131 and a grounding element 132. In the present embodiment, the first feeding sub-element 160*c* is exposed from the electromagnetic interference shielding element 130.

Figure 37G:
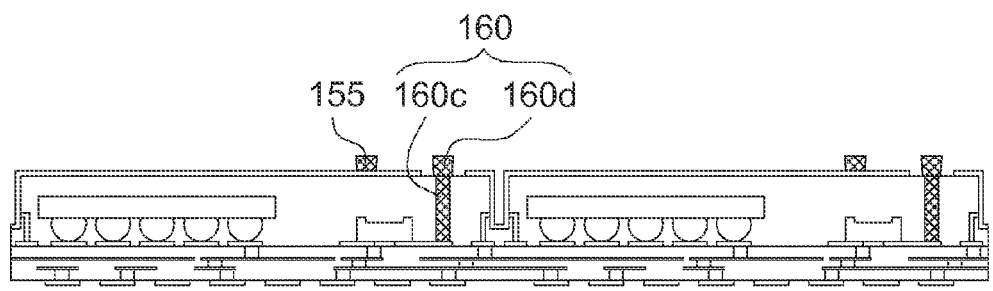

Referring to FIG. 37G, a second sub-element 160*d* is formed in the first sub-element 160*c* by wire-bond technique. The second sub-element 160*d* is made from a bond wire material. The first sub-element 160*c* and the second sub-element 160*d* are combined as the feeding element 160. An antenna grounding element 155 is formed in the electromagnetic interference shielding element 130 by wire-bond technique.

Figure 37H:
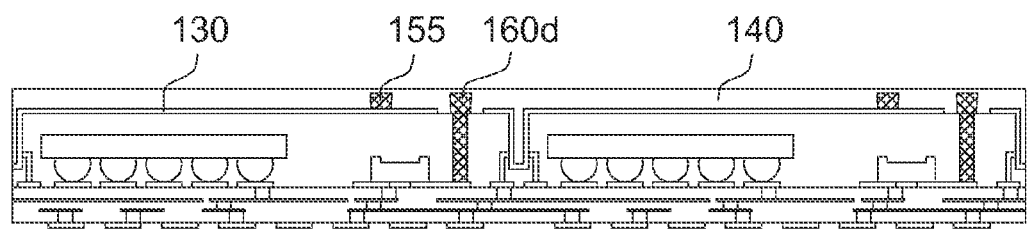

Referring to FIG. 37H, a dielectric structure 140 covering the second sub-element 160*d*, electromagnetic interference shielding element 130 and the antenna grounding element 155 is formed.

Figure 37I:
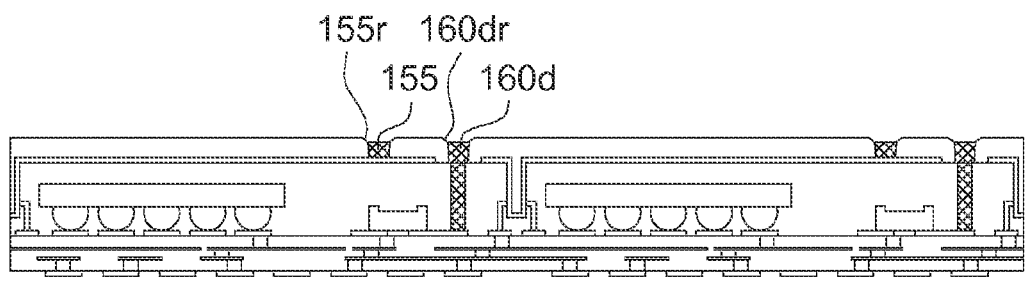

Referring to FIG. 37I, openings 155*r* and 160*dr* are formed to expose the antenna grounding element 155 and the second sub-element 160*d*, respectively.

Figure 37J:
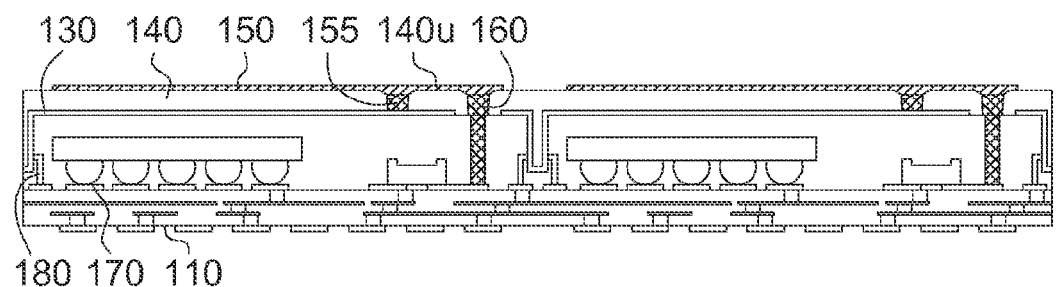

Referring to FIG. 37J, an antenna element 150 formed on an upper surface 140*u* of the dielectric structure 140 is formed, wherein the antenna element 150 directly contacts the feeding element 160 and the antenna grounding element 155, so that the antenna element 150 is electrically connected to the circuit structure 110 through the feeding element 160, and electrically connected to the grounding segment 170 through the antenna grounding element 155 and the electromagnetic interference shielding element 130. In addition, the antenna element 150 can be formed using plating/etching photolithographic processes as described above.

Figure 37K:
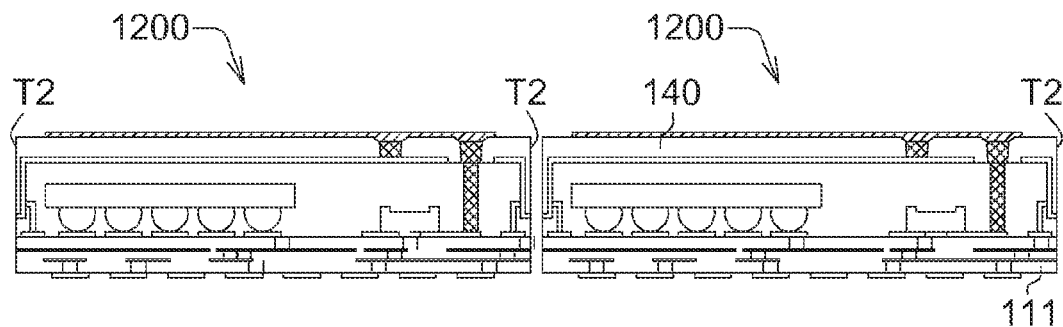

Referring to FIG. 37K, a plurality of second singulation paths T2 are formed, wherein the second singulation paths T2 pass through the dielectric structure 140 and the entire first substrate 111, to form the semiconductor package 1200, as illustrated in FIG. 24. The second singulation paths T2 can be formed by a laser or other cutting tool.

Figure 38A:
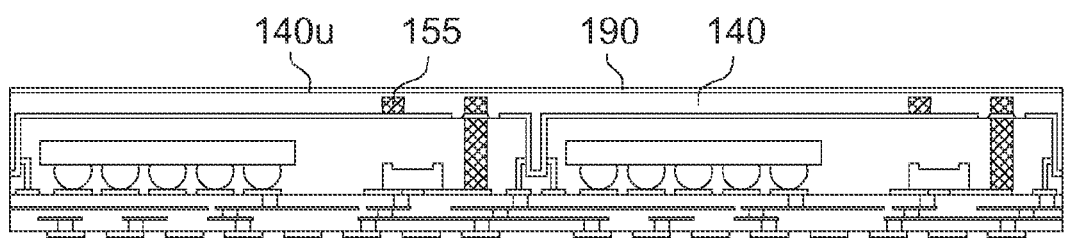
FIGS. 38A-38C illustrate manufacturing processes according to the semiconductor package of FIG. 25.
Figure 38B:
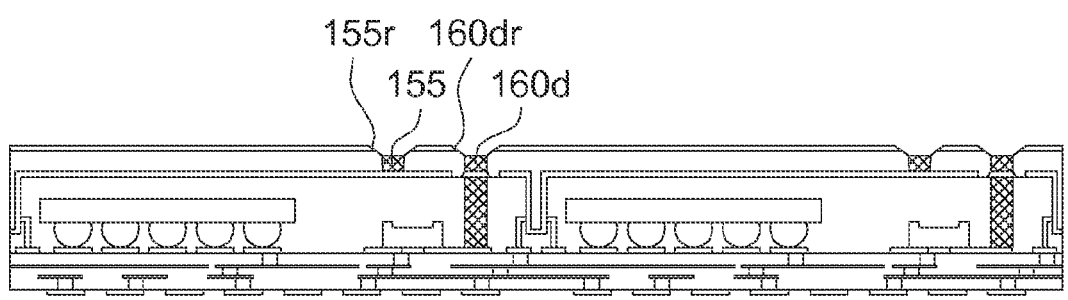
Figure 38C:
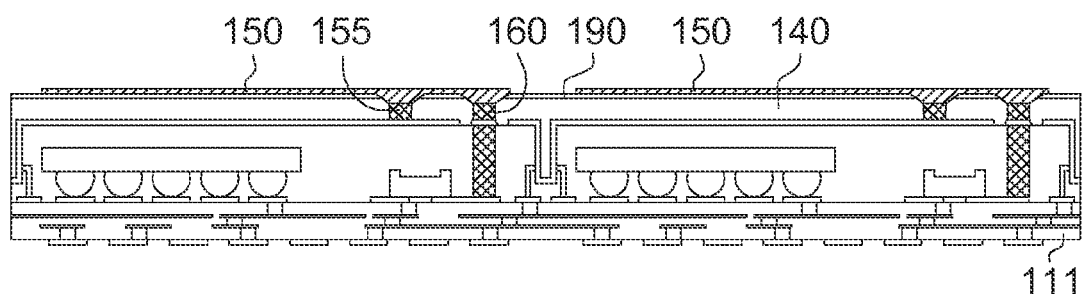

Referring to FIGS. 38A-38C, processes for manufacturing the semiconductor package 1300 of FIG. 25 are illustrated.

Referring to FIG. 38A, a dielectric material layer 190 covering the upper surface 140*u* of a dielectric structure 140 is formed.

Referring to FIG. 38B, the openings 155*r* and 160*dr* are formed to expose the antenna grounding element 155 and the second sub-element 160*d*, respectively.

Referring to FIG. 38C, the antenna grounding element 155 is formed on an upper surface of the dielectric material layer 190 to directly contact the feeding element 160 and the antenna grounding element 155. Then, a number of second singulation paths (not illustrated) are formed, wherein the second singulation paths pass through the dielectric structure 140 and the entire first substrate 111 to form the semiconductor package 1300, as illustrated in FIG. 25.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
a substrate;
a semiconductor die disposed on the substrate;
a package body encapsulating the semiconductor die and having an upper surface;

an electromagnetic interference shield formed directly on the upper surface of the package body;
a dielectric structure covering the electromagnetic interference shield;
an antenna formed on the dielectric structure;
a feeding element connecting the antenna and a feeding point of the substrate; and
an antenna grounding element connecting the antenna and the electromagnetic interference shield, wherein the feeding element penetrates the package body and the dielectric structure.

2. The semiconductor package of claim 1, wherein the antenna grounding element is disposed within the dielectric structure.

3. The semiconductor package of claim 1, wherein the antenna grounding element and the feeding element form an extension portion of the antenna on a lateral surface of the dielectric structure.

4. The semiconductor package of claim 1, further comprising:
a grounding frame disposed on the substrate and connecting the substrate and the electromagnetic interference shield.

5. The semiconductor package of claim 1, further comprising:
a dielectric material layer covering the dielectric structure;
wherein the permittivity of the dielectric material layer is higher than that of the dielectric structure.

6. The semiconductor package of claim 1, wherein the antenna grounding element is a conductive via.

7. The semiconductor package of claim 6, wherein the antenna grounding element penetrates the dielectric structure and connects the antenna and the electromagnetic interference shield.

8. The semiconductor package of claim 6, wherein the antenna grounding element includes a conductive material disposed in a through hole in the dielectric structure, the through hole extending from the antenna to the electromagnetic interference shield.

9. The semiconductor package of claim 1, wherein the electromagnetic interference shield is a film formed directly onto the package body.

10. The semiconductor package of claim 9, wherein the film comprising the electromagnetic shield is formed by material deposition.

11. A semiconductor package, comprising:
a substrate;
a semiconductor die disposed on the substrate;
a package body encapsulating the semiconductor die and having an upper surface;
an electromagnetic interference shield disposed directly on the upper surface of the package body;
a dielectric structure covering the electromagnetic interference shield;
an antenna formed on the dielectric structure;
a feeding element connecting the antenna and a feeding point of the substrate; and
a conductive via penetrating entirely through the dielectric structure connecting the antenna and the electromagnetic interference shield, forming an antenna grounding element wherein the feeding element penetrates the package body and the dielectric structure.

12. The semiconductor package of claim 11, further comprising:
a grounding frame disposed on the substrate and connecting the substrate and the electromagnetic interference shield.

13. The semiconductor package of claim 11, further comprising:
a dielectric material layer covering the dielectric structure;
wherein the permittivity of the dielectric material layer is higher than that of the dielectric structure.

14. The semiconductor package of claim 13, wherein the dielectric material layer is a ceramic material.

15. The semiconductor package of claim 11, wherein the package body further comprises a lateral side and the electromagnetic interference shield extends to, and is disposed directly on, the lateral side.

16. A semiconductor package, comprising:
a substrate;
a die disposed on the substrate;
a package body encapsulating the die and having an upper surface;
an electromagnetic interference shield comprising a film disposed directly onto the upper surface of the package body;
a dielectric structure covering the electromagnetic interference shield;
an antenna disposed on an upper surface of the dielectric structure;
a feeding element connecting the antenna and a feeding point of the substrate; and
a conductive via formed in the dielectric structure connecting the antenna and the electromagnetic interference shield, forming an antenna grounding element wherein the feeding element penetrates the package body and the dielectric structure.

17. The semiconductor package of claim 16, wherein the conductive via is formed in a through hole in the dielectric structure, the through hole extending from the antenna to the electromagnetic interference shield.

18. The semiconductor package of claim 16, wherein the electromagnetic interference shield is formed by material deposition directly onto the package body.

* * * * *